United States Patent
Choksi et al.

(10) Patent No.: US 8,615,205 B2
(45) Date of Patent: Dec. 24, 2013

(54) I-Q MISMATCH CALIBRATION AND METHOD

(75) Inventors: Ojas M. Choksi, San Diego, CA (US); Frederic Bossu, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 909 days.

(21) Appl. No.: 12/259,178

(22) Filed: Oct. 27, 2008

(65) Prior Publication Data

US 2009/0154595 A1 Jun. 18, 2009

Related U.S. Application Data

(60) Provisional application No. 61/014,662, filed on Dec. 18, 2007.

(51) Int. Cl.
 *H03C 1/62* (2006.01)
(52) U.S. Cl.
 USPC .................................. 455/115.1; 455/241.1
(58) Field of Classification Search
 USPC .......... 455/115.1, 241.1, 234.1, 234.2, 245.1, 455/253.2, 324
 See application file for complete search history.

(56) References Cited

U.S. PATENT DOCUMENTS

| | | |
|---|---|---|
| 4,061,882 A | 12/1977 | Dorren |
| 4,333,020 A | 6/1982 | Maeder |
| 4,555,777 A | 11/1985 | Poteet |
| 4,623,801 A | 11/1986 | Rocchi |
| 4,716,320 A | 12/1987 | McAdams |
| 4,959,557 A | 9/1990 | Miller |
| 4,995,589 A | 2/1991 | Adishian et al. |
| 5,097,157 A | 3/1992 | Jaffe et al. |
| 5,103,114 A | 4/1992 | Fitch |
| 5,103,116 A | 4/1992 | Sivilotti et al. |
| 5,103,144 A | 4/1992 | Dunham |
| 5,192,875 A | 3/1993 | Kielmeyer, Jr. |
| 5,375,258 A | 12/1994 | Gillig |

(Continued)

FOREIGN PATENT DOCUMENTS

| | | |
|---|---|---|
| CN | 1412947 A | 4/2003 |
| EP | 0398751 A2 | 11/1990 |

(Continued)

OTHER PUBLICATIONS

International Search Report & Written Opinion—PCT/US2008/086793, International Search Authority—European Patent Office—Oct. 7, 2009.

(Continued)

*Primary Examiner* — Henry Choe
(74) *Attorney, Agent, or Firm* — S. Hossain Beladi

(57) ABSTRACT

Techniques are provided for reducing mismatch between the in-phase (I) and quadrature (Q) channels of a communications transmitter or receiver. In an exemplary embodiment, separate voltages are applied to bias the gates or bulks of the transistors in a mixer of the I channel versus a mixer of the Q channel. In another exemplary embodiment, separate voltages are applied to bias the common-mode reference voltage of a transimpedance amplifier associated with each channel. Techniques are further provided for deriving bias voltages to minimize a measured residual sideband in a received or transmitted signal, or to optimize other parameters of the received or transmitted signal. Techniques for generating separate bias voltages using a bidirectional and unidirectional current digital-to-analog converter (DAC) are also disclosed.

46 Claims, 19 Drawing Sheets

(56) References Cited

U.S. PATENT DOCUMENTS

| | | |
|---|---|---|
| 5,477,180 A | 12/1995 | Chen |
| 5,534,803 A | 7/1996 | Correale, Jr. et al. |
| 5,682,109 A | 10/1997 | Ohmi et al. |
| 5,708,399 A | 1/1998 | Fujii et al. |
| 5,983,082 A | 11/1999 | Hilbert |
| 5,994,935 A | 11/1999 | Ueda et al. |
| 6,014,047 A | 1/2000 | Dreps et al. |
| 6,037,816 A | 3/2000 | Yamauchi |
| 6,057,823 A | 5/2000 | Aoki et al. |
| 6,166,571 A | 12/2000 | Wang |
| 6,169,434 B1 | 1/2001 | Portmann |
| 6,188,291 B1 | 2/2001 | Gopinathan et al. |
| 6,191,629 B1 | 2/2001 | Bisanti et al. |
| 6,239,640 B1 | 5/2001 | Liao et al. |
| 6,310,501 B1 | 10/2001 | Yamashita |
| 6,316,987 B1 | 11/2001 | Dally et al. |
| 6,320,418 B1 | 11/2001 | Fujii et al. |
| 6,320,438 B1 | 11/2001 | Arcus |
| 6,420,921 B1 | 7/2002 | Okayasu et al. |
| 6,426,660 B1 | 7/2002 | Ho et al. |
| 6,433,589 B1 | 8/2002 | Lee |
| 6,542,015 B2 | 4/2003 | Zhou et al. |
| 6,593,789 B2 | 7/2003 | Atallah et al. |
| 6,661,269 B2 | 12/2003 | Simon et al. |
| 6,667,703 B1 | 12/2003 | Reuveni et al. |
| 6,674,772 B1 | 1/2004 | Dally et al. |
| 6,831,497 B2 | 12/2004 | Koh et al. |
| 6,836,240 B1 | 12/2004 | Dubbert et al. |
| 6,897,696 B2 | 5/2005 | Chang |
| 6,904,538 B2 | 6/2005 | Glas et al. |
| 6,933,759 B1 | 8/2005 | Wu et al. |
| 6,967,514 B2 | 11/2005 | Kizer et al. |
| 7,075,377 B2 | 7/2006 | Metaxakis |
| 7,099,643 B2 | 8/2006 | Lin |
| 7,110,469 B2* | 9/2006 | Shi et al. .................. 375/295 |
| 7,184,512 B2 | 2/2007 | Takeshita et al. |
| 7,239,209 B2 | 7/2007 | Adan |
| 7,271,622 B2 | 9/2007 | Metaxakis |
| 7,298,222 B2 | 11/2007 | Rosik et al. |
| 7,307,461 B2 | 12/2007 | Nguyen et al. |
| 7,315,220 B1 | 1/2008 | Robinson et al. |
| 7,323,944 B2 | 1/2008 | Florescu et al. |
| 7,336,114 B2 | 2/2008 | Razavi et al. |
| 7,352,229 B1 | 4/2008 | Mei et al. |
| 7,388,416 B2 | 6/2008 | Marutani |
| 7,423,468 B2 | 9/2008 | Cho |
| 7,457,605 B2 | 11/2008 | Thompson et al. |
| 7,474,715 B1 | 1/2009 | Ni et al. |
| 7,521,976 B1 | 4/2009 | Sudjian et al. |
| 7,554,380 B2 | 6/2009 | Embabi et al. |
| 7,580,483 B2 | 8/2009 | Ibrahim et al. |
| 7,603,094 B2* | 10/2009 | Rahman et al. ............. 455/241.1 |
| 7,616,938 B2 | 11/2009 | Behzad et al. |
| 7,619,456 B2 | 11/2009 | Kim et al. |
| 7,656,205 B2 | 2/2010 | Chen et al. |
| 7,683,682 B1 | 3/2010 | Won et al. |
| 7,693,230 B2 | 4/2010 | Sorrells et al. |
| 7,715,836 B2* | 5/2010 | Vassiliou et al. ............. 455/423 |
| 7,750,708 B2 | 7/2010 | Gschier |
| 7,750,749 B2 | 7/2010 | Jones |
| 7,768,330 B2 | 8/2010 | Yuuki et al. |
| 7,808,329 B2 | 10/2010 | Azadet et al. |
| 7,821,315 B2 | 10/2010 | Bossu et al. |
| 7,932,844 B1 | 4/2011 | Huynh et al. |
| 7,965,111 B2 | 6/2011 | Sun et al. |
| 8,095,103 B2 | 1/2012 | Asuri |
| 8,164,361 B2 | 4/2012 | Soltanian et al. |
| 8,248,132 B2 | 8/2012 | Chang |
| 2001/0050583 A1 | 12/2001 | Fulkerson |
| 2002/0000834 A1 | 1/2002 | Ooishi |
| 2002/0079938 A1 | 6/2002 | Saeki |
| 2002/0113270 A1 | 8/2002 | Bernstein et al. |
| 2002/0160740 A1 | 10/2002 | Hatcher et al. |
| 2003/0042957 A1 | 3/2003 | Tamura |
| 2003/0102926 A1 | 6/2003 | Hsieh |
| 2004/0008092 A1 | 1/2004 | Hajimiri et al. |
| 2004/0036541 A1 | 2/2004 | Fang et al. |
| 2004/0051397 A1 | 3/2004 | Juntunen et al. |
| 2004/0147238 A1* | 7/2004 | Wang et al. .................. 455/208 |
| 2004/0212741 A1 | 10/2004 | Hijikata et al. |
| 2005/0024097 A1 | 2/2005 | Sim et al. |
| 2005/0122149 A1 | 6/2005 | Cho et al. |
| 2005/0174157 A1 | 8/2005 | Calo et al. |
| 2006/0035617 A1 | 2/2006 | Kim |
| 2006/0059376 A1 | 3/2006 | Ngo et al. |
| 2006/0067424 A1 | 3/2006 | Wolf |
| 2006/0119446 A1 | 6/2006 | Li et al. |
| 2007/0037544 A1 | 2/2007 | Heikkinen |
| 2007/0076832 A1 | 4/2007 | Matsudera |
| 2007/0239319 A1 | 10/2007 | Inukai et al. |
| 2007/0242548 A1 | 10/2007 | Tonti et al. |
| 2007/0273485 A1 | 11/2007 | Balachandran et al. |
| 2007/0285120 A1 | 12/2007 | Venditti et al. |
| 2008/0001645 A1 | 1/2008 | Kuroki |
| 2008/0032646 A1 | 2/2008 | Huang et al. |
| 2008/0048736 A1 | 2/2008 | Ruy |
| 2008/0061894 A1 | 3/2008 | Raita et al. |
| 2008/0074148 A1 | 3/2008 | Srivastava et al. |
| 2008/0096508 A1 | 4/2008 | Luff |
| 2008/0106313 A1 | 5/2008 | Keady et al. |
| 2008/0116902 A1 | 5/2008 | Kim et al. |
| 2008/0132195 A1 | 6/2008 | Maxim et al. |
| 2008/0180139 A1 | 7/2008 | Natonio et al. |
| 2008/0225169 A1 | 9/2008 | Takita et al. |
| 2008/0231379 A1 | 9/2008 | Jang et al. |
| 2008/0258781 A1 | 10/2008 | Song et al. |
| 2009/0033430 A1 | 2/2009 | Jang et al. |
| 2009/0066157 A1 | 3/2009 | Tarng et al. |
| 2009/0102520 A1 | 4/2009 | Lee et al. |
| 2009/0108885 A1 | 4/2009 | Natonio et al. |
| 2009/0131006 A1 | 5/2009 | Wu |
| 2009/0154595 A1 | 6/2009 | Choksi et al. |
| 2009/0156135 A1 | 6/2009 | Kamizuma et al. |
| 2009/0184741 A1 | 7/2009 | Suda et al. |
| 2009/0256596 A1 | 10/2009 | Oh |
| 2009/0284288 A1 | 11/2009 | Zhang et al. |
| 2009/0284311 A1 | 11/2009 | Ito |
| 2009/0310711 A1 | 12/2009 | Chiu et al. |
| 2010/0012648 A1 | 1/2010 | Gustafsson et al. |
| 2010/0120390 A1 | 5/2010 | Panikkath et al. |
| 2010/0130139 A1 | 5/2010 | Panikkath et al. |
| 2010/0194485 A1 | 8/2010 | Chawla et al. |
| 2010/0198540 A1 | 8/2010 | Yanagisawa et al. |
| 2010/0226459 A1 | 9/2010 | Park et al. |
| 2011/0001522 A1 | 1/2011 | Chan et al. |
| 2011/0012648 A1 | 1/2011 | Qiao et al. |
| 2011/0043291 A1 | 2/2011 | Fagg |
| 2011/0050296 A1 | 3/2011 | Fagg |
| 2011/0181330 A1 | 7/2011 | Oh |
| 2012/0187994 A1 | 7/2012 | Yang et al. |
| 2013/0012150 A1 | 1/2013 | Panikkath et al. |

FOREIGN PATENT DOCUMENTS

| | | |
|---|---|---|
| EP | 0637134 A1 | 2/1995 |
| EP | 0872956 A2 | 10/1998 |
| EP | 1345317 A2 | 9/2003 |
| EP | 1394944 | 3/2004 |
| EP | 1416691 A1 | 5/2004 |
| EP | 1655591 A1 | 5/2006 |
| EP | 1679796 A1 | 7/2006 |
| EP | 2294691 A2 | 3/2011 |
| FR | 2670975 A1 | 6/1992 |
| GB | 2321144 A | 7/1998 |
| JP | 53048401 A | 5/1978 |
| JP | 59008112 A | 1/1984 |
| JP | 62141219 U | 9/1987 |
| JP | 63078610 A | 4/1988 |
| JP | H0194723 A | 4/1989 |
| JP | 2058951 A | 2/1990 |
| JP | 2060330 U | 5/1990 |
| JP | 2131615 A | 5/1990 |
| JP | H03262317 A | 11/1991 |
| JP | 5268000 A | 10/1993 |

(56) References Cited

FOREIGN PATENT DOCUMENTS

| | | |
|---|---|---|
| JP | 7170162 A | 7/1995 |
| JP | 9046195 A | 2/1997 |
| JP | 9191238 A | 7/1997 |
| JP | 10111674 A | 4/1998 |
| JP | 10247842 A | 9/1998 |
| JP | 2000332583 A | 11/2000 |
| JP | 2001245007 A | 9/2001 |
| JP | 2001312328 A | 11/2001 |
| JP | 2001313228 A | 11/2001 |
| JP | 2002043900 A | 2/2002 |
| JP | 2002064367 A | 2/2002 |
| JP | 2003101397 A | 4/2003 |
| JP | 2003512752 A | 4/2003 |
| JP | 2003224471 A | 8/2003 |
| JP | 2004531126 A | 10/2004 |
| JP | 2004336822 A | 11/2004 |
| JP | 2005110080 A | 4/2005 |
| JP | 2006093748 A | 4/2006 |
| JP | 2006115148 A | 4/2006 |
| JP | 2006173897 A | 6/2006 |
| JP | 2006217563 A | 8/2006 |
| JP | 2006287819 A | 10/2006 |
| JP | 2006314029 A | 11/2006 |
| JP | 2007102483 A | 4/2007 |
| JP | 2008029008 A | 2/2008 |
| JP | 2008054134 A | 3/2008 |
| JP | 2008124836 A | 5/2008 |
| JP | 2010003925 A | 1/2010 |
| KR | 20050055925 A | 6/2005 |
| TW | 200529566 | 9/2005 |
| TW | 200723676 | 6/2007 |
| TW | I283515 B | 7/2007 |
| WO | WO9621270 A1 | 7/1996 |
| WO | WO9912259 A2 | 3/1999 |
| WO | WO0129965 A1 | 4/2001 |
| WO | WO02051091 A1 | 6/2002 |
| WO | 02052691 A1 | 7/2002 |
| WO | WO2006033203 A1 | 3/2006 |
| WO | WO2009036397 | 3/2009 |
| WO | WO2009036399 | 3/2009 |
| WO | WO2010068504 | 6/2010 |

OTHER PUBLICATIONS

Chan, et al., "Hercules (RTR9800) Divider", Aug. 2005.
Chan, "Hercules (RTR8700) Divider", Aug. 2005.
Navid S et al., "Level-Locked Loop: A Technique for Broadband Quadrature Signal Generation", Custom Integrated Circuits Conference, 1997., Proceedings of the IEEE 1997 Santa Clara, CA, USA May 5-8, 1997, New York, NY, USA,IEEE, US, May 5, 1997, pp. 411-414, XP010235334, DOI: 10.1109/CICC.1997.606656 ISBN: 978-0-7803-3669-8.
Roufoogaran R, et al., "A compact and power efficient local oscillator generation and distribution system for complex multi radio systems" Radio Frequency Integrated Circuits Symposium, 2008. RFIC 2008. IEEE, IEEE, Piscataway, NJ, USA, Jun. 17, 2008, pp. 277-280, XP031284334 ISBN: 978-1-4244-1808-4 *Section 111. Detailed Description*; p. 277-p. 279.
Taiwan Search Report—TW097149468—TIPO—Mar. 21, 2012.
Lee, T.H., et al., "A 2.5 V CMOS delay-locked loop for 18 Mbit, 500 megabyte/s DRAM," Solid-State Circuits, IEEE Journal of, vol. 29, No. 12, pp. 1491-1496, Dec. 1994.
Fuse, T et al: "A 1.1V SOI CMOS Frequency Divider Using Body-Inputting SCL Circuit Technology" 2000 IEEE International SOI Conference Proceedings. Wakefield, MA, Oct. 2-5, 2000; [IEEE International SOI Conference], New York, NY: IEEE, US, Oct. 2, 2000, p. 106/107, XP001003452, ISBN: 978-0/7803-6390-8 p. 106; figure 3.
European Search Report—EP13159605—Search Authority—The Hague—Apr. 16, 2013.

\* cited by examiner

I MIXER

Q MIXER

US 8,615,205 B2

I-Q MISMATCH CALIBRATION AND METHOD

CLAIM OF PRIORITY UNDER 35 U.S.C. §119

The present Application for Patent claims priority to U.S. Provisional Application Ser. No. 61/014,662, filed Dec. 18, 2007, entitled "I-Q Mismatch Calibration," assigned to the assignee hereof, the disclosure of which is hereby expressly incorporated by reference herein.

TECHNICAL FIELD

The disclosure relates to communications transceivers and, more particularly, to techniques for correcting mismatch between in-phase (I) and quadrature (Q) mixers in communications transceivers.

BACKGROUND

In a communications transmitter, information may be modulated onto orthogonal signals known as in-phase (I) and quadrature (Q) carriers to form I and Q channels. At the receiver, the I and Q channels may be demodulated to recover the information of interest. Typically, a mixer is provided to modulate or demodulate each channel, i.e., an I mixer for the I channel, and a Q mixer for the Q channel.

Accurate transmission and reception of information requires that the I and Q channels remain orthogonal to each other over the communications link. In practice, mismatch between the I and Q channels, e.g., the mixers of the I and Q channels at either the transmitter or the receiver, introduces correlation between the I and Q channels, causing information from the I channel to "bleed" into the Q channel, and vice versa. This leads to corruption of the information signals.

It would be desirable to provide techniques for reducing mismatch between the I and Q channels.

SUMMARY

An aspect of the present disclosure provides an apparatus comprising: an in-phase (I) signal path and a quadrature (Q) signal path, the I signal path having at least one I bias voltage or I bias current, and the Q signal path having at least one corresponding Q bias voltage or Q bias current; and an offset calibration control for controlling at least one of the I bias voltage, I bias current, Q bias voltage, or Q bias current, such that at least one of the I bias voltage or I bias current has a different value from a corresponding one of the Q bias voltage or Q bias current.

Another aspect of the present disclosure provides a method for reducing mismatch between in-phase (I) and quadrature (Q) signal paths in a communications apparatus, the method comprising: applying an offset between a bias for an element of the I signal path and a bias for an element of the Q signal path.

Yet another aspect of the present disclosure provides an apparatus comprising: an in-phase (I) signal path and a quadrature (Q) signal path; and means for applying an offset between a bias for an element of the I signal path and a bias for an element of the Q signal path.

Yet another aspect of the present disclosure provides a computer program product for specifying an offset to be applied between an element of an I signal path and an element of a corresponding Q signal path in a communications apparatus, the product comprising: computer-readable medium comprising: code for causing a computer to measure I and Q input signals coupled to outputs of the I and Q signal paths, respectively; and code for causing a computer to adjust the applied offset based on the measured I and Q input signals.

Yet another aspect of the present disclosure provides an apparatus for converting two digitally specified voltages into two analog voltages, the two digitally specified voltages comprising a first digital signal and a second digital signal, the two analog voltages being generated at a first output node and a second output node, the conversion module comprising: a voltage digital-to-analog converter for converting the first digital signal to a first analog voltage; a unidirectional current digital-to-analog converter for converting the second digital signal to a second analog current at a current node; a first set of switches coupling, when the switches are turned on, the first analog voltage to the current node via the first output node and a resistance; and a second set of switches coupling, when the switches are turned on, the first analog voltage to the current node via the second output node and a resistance.

DETAILED DESCRIPTION

The detailed description set forth below in connection with the appended drawings is intended as a description of exemplary embodiments of the present invention and is not intended to represent the only exemplary embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Figure 1:
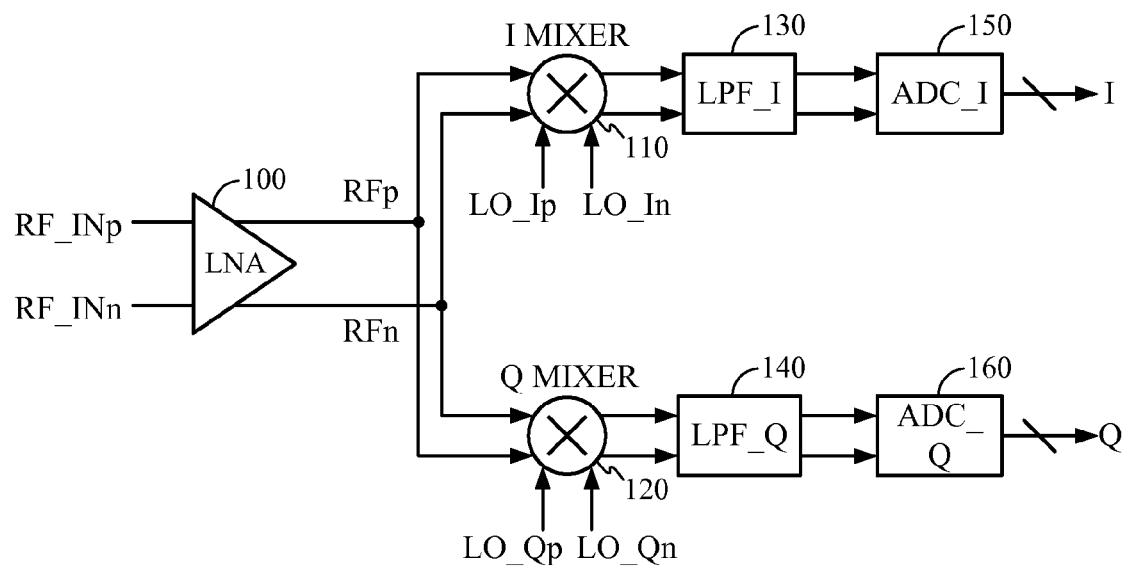
FIG. 1 depicts an exemplary embodiment of a prior art receiver for a communications system.

FIG. 1 depicts an exemplary embodiment of a prior art receiver for a communications system. In FIG. 1, differential RF input signal RF_INp/RF_INn is provided to a low-noise amplifier (LNA) 100, which amplifies the input signal to produce a differential RF signal RFp/RFn. RFp/RFn is provided to an I mixer 110 and a Q mixer 120. I mixer 110 mixes RFp/RFn with a differential in-phase local oscillator signal LO_Ip/LO_In, while Q mixer 120 mixes RFp/RFn with a differential quadrature local oscillator signal LO_Qp/LO_Qn. The outputs of the mixers 110, 120 are provided to low-pass filters 130, 140, respectively, and subsequently digitized by analog-to-digital converters 150, 160 to produce digital outputs I and Q.

Note the receiver depicted in FIG. 1 is a direct conversion receiver, i.e., the received RF signal is converted directly to baseband by the mixers 110, 120. One of ordinary skill in the art will realize that the techniques disclosed herein may readily be applied to receivers having a non-zero intermediate frequency (IF). Such exemplary embodiments are contemplated to be within the scope of the present disclosure.

Note the particular receiver architecture depicted in FIG. 1 may be considered as having two signal paths: an I signal path including I mixer 110, LPF_I 130, ADC_I 150, and a Q signal path including Q mixer 120, LPF_Q 140, ADC_Q 160. Unless otherwise noted, one of ordinary skill in the art will realize that comments made with reference to one of the (I or Q) signal paths or channels may generally be applied to the other signal path or channel.

One of ordinary skill in the art will realize that an I signal path or a Q signal path may include fewer or more elements than shown in the representative architecture of FIG. 1. For example, an I or Q signal path may also include filters, amplifiers, transimpedance (Gm) blocks in addition to the elements shown. It is contemplated that the techniques disclosed herein may be analogously applied by one of ordinary skill in the art to other such elements not explicitly described. One of ordinary skill in the art will also realize that I and Q signal paths may be present in transmitter architectures as well as receiver architectures, and that the techniques of the present disclosure may be correspondingly applied to transmitter architectures as well.

In FIG. 1, the I local oscillator signal LO_I and the Q local oscillator signal LO_Q are designed to be 90 degrees out of phase with each other, while the I mixer 110 and Q mixer 120 are designed to have identical gain responses. In practice, the phase difference between LO_I and LO_Q may deviate from 90 degrees, and the gains of the I mixer 110 and Q mixer 120 may be mismatched. These factors, as well as other imbalances between the I and Q signal paths, may be collectively referred to as "I-Q mismatch." I-Q mismatch may lead to undesirable corruption of the demodulated information signals.

According to an aspect the present disclosure, techniques are provided to reduce I-Q mismatch by applying an offset between the corresponding voltages used to bias the I and Q signal paths.

Figure 2:
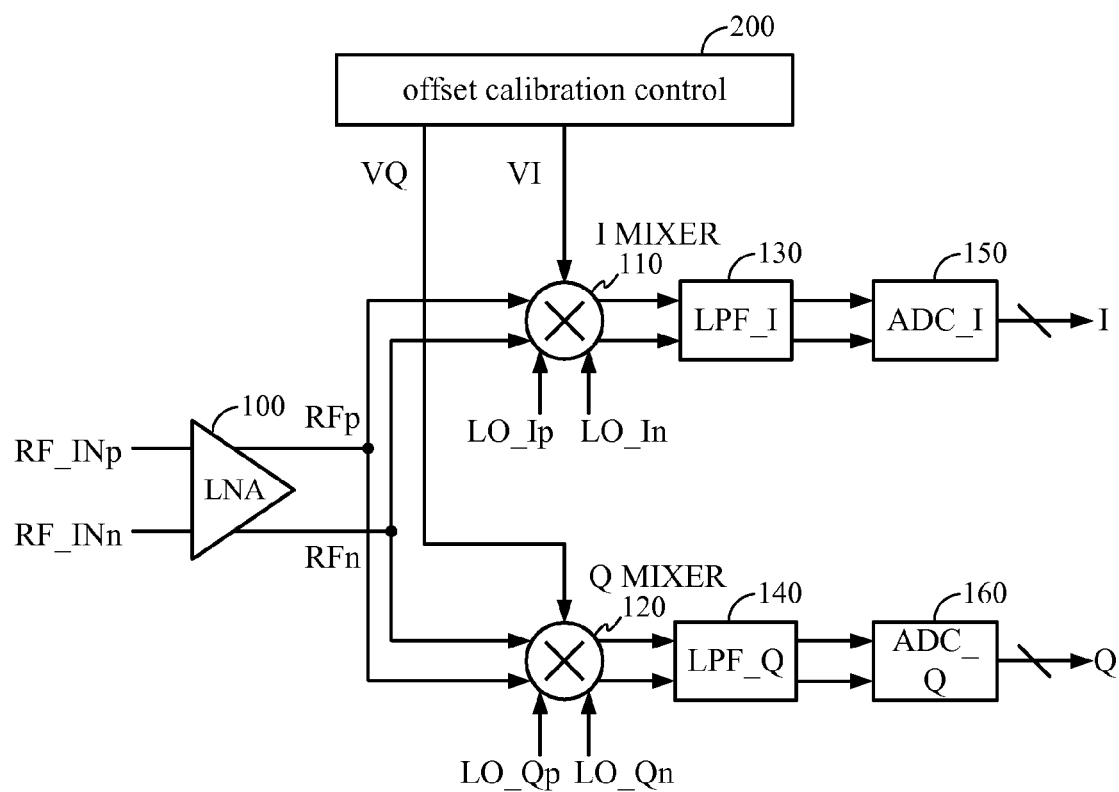
FIG. 2 depicts an exemplary embodiment of the receiver shown in FIG. 1, wherein an additional offset calibration control 200 generates one control voltage or set of control voltages VI to bias the I mixer 110, and one control voltage or set of control voltages VQ to bias the Q mixer 120.

FIG. 2 depicts an exemplary embodiment of the receiver shown in FIG. 1, wherein an additional offset calibration control 200 generates one control voltage or set of control voltages VI to bias the I mixer 110, and one control voltage or set of control voltages VQ to bias the Q mixer 120. One of ordinary skill in the art will realize that the techniques disclosed herein may readily be modified to accommodate, equivalently, a fixed (non-adjustable) bias voltage or set of bias voltages for either the I or the Q mixer, and a variable (adjustable) bias voltage for the other mixer. Such exemplary embodiments are contemplated to be within the scope of the present disclosure.

While VI and VQ are shown as being applied to the I and Q mixers in FIG. 2, one of ordinary skill in the art will realize that the bias voltages may be applied to other elements such as a Gm blocks and/or trans-impedance amplifier blocks, in accordance with the principles described later herein. One of ordinary skill in the art will realize that offsets in the bias voltages may be applied to any element in either signal path that contributes to the net gain (e.g., amplitude or phase) of that signal path. Such exemplary embodiments are contemplated to be within the scope of the present disclosure.

Figure 3A:
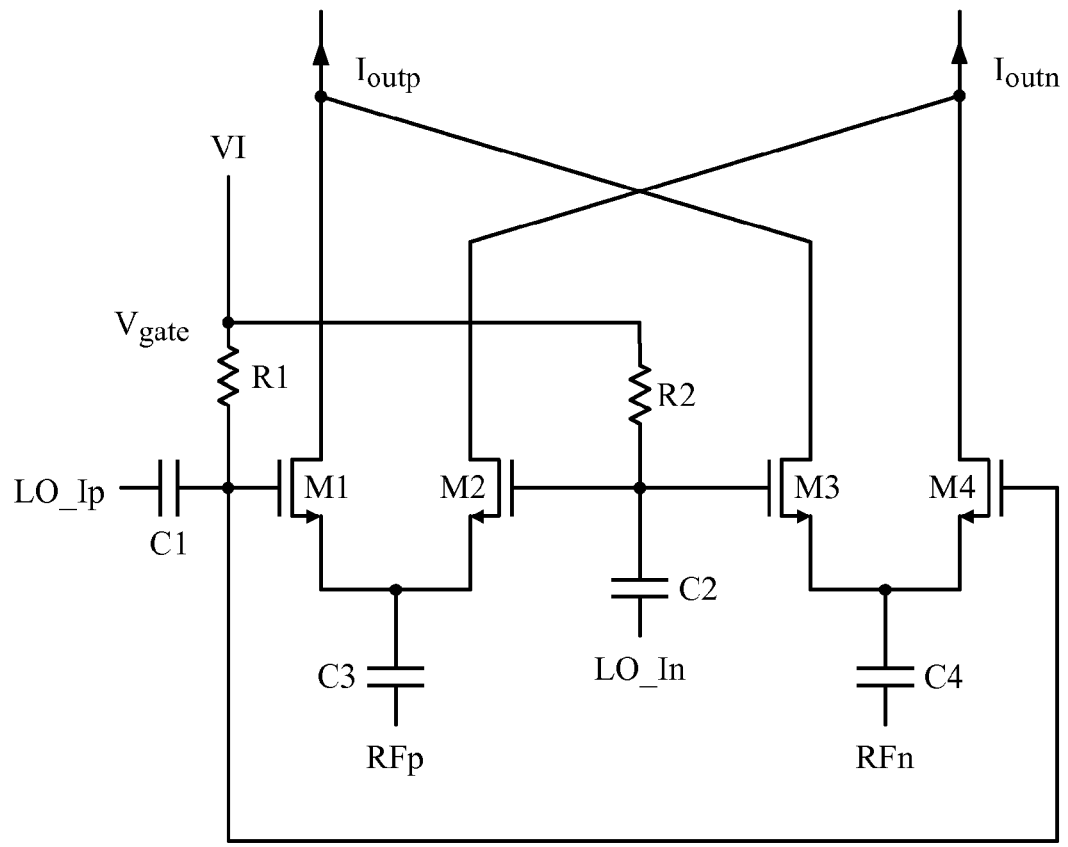
FIG. 3A depicts an exemplary embodiment of the I mixer 110 shown in FIG. 2, wherein the control voltage VI is applied to bias the gates of transistors M1, M2, M3, M4.

FIG. 3A depicts an exemplary embodiment of the I mixer 110 shown in FIG. 2, wherein the control voltage VI is applied to bias the gates of transistors M1, M2, M3, M4. In FIG. 3A, the differential in-phase local oscillator signal LO_Ip/LO_In is AC coupled to the gates of transistors M1, M2, M3, M4 through coupling capacitors C1 and C2. The control voltage VI is set to the gate bias voltage Vgate, which is applied to the gates of transistors M1, M2, M3, M4 through resistors R1 and R2. RFp and RFn of differential signal RFp/RFn are AC coupled to the sources of the differential pairs M1/M2 and M3/M4, respectively. During operation, the differential output current Ioutp/Ioutn contains a signal component proportional to the mixed product of the LO signal and the RF signal.

Note one of ordinary skill in the art will realize that the exemplary embodiment depicted in FIG. 3A may be similarly applied to bias the corresponding gates of transistors in a Q mixer (not shown) using the control voltage VQ.

Figure 3B:
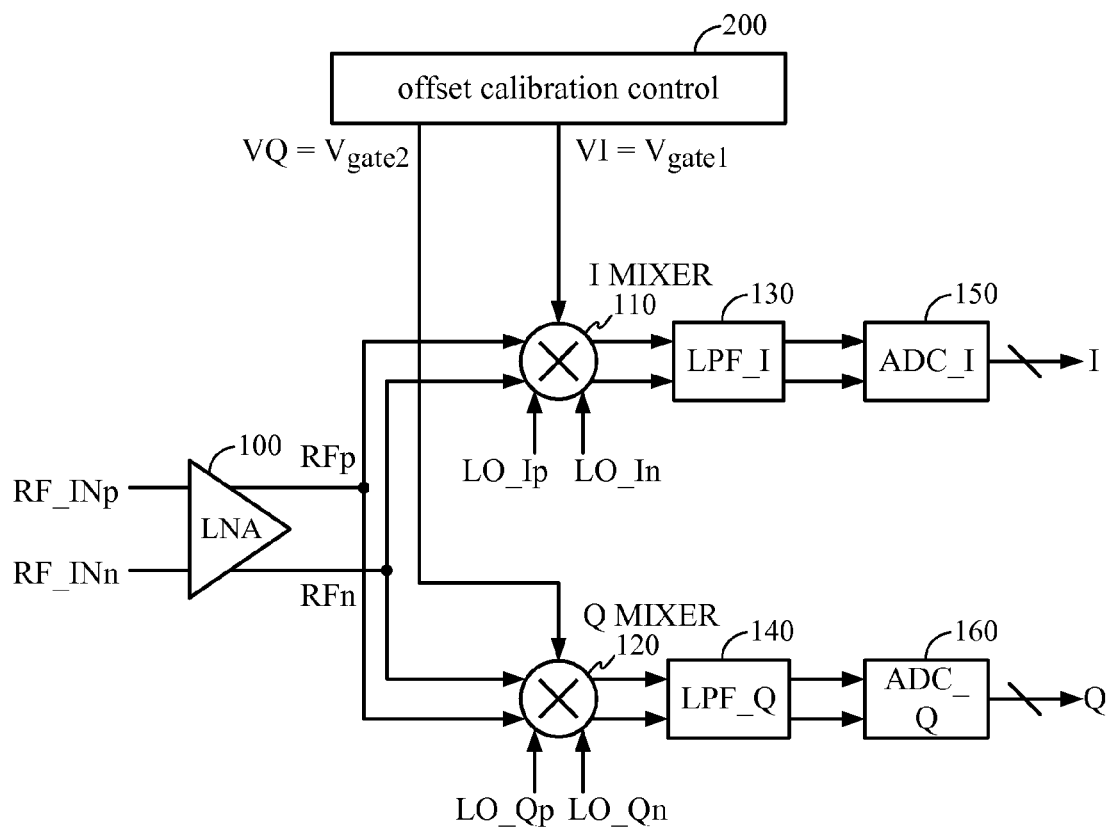
FIG. 3B depicts an exemplary embodiment of the receiver of FIG. 2 wherein the offset calibration control 200 generates a voltage VI=Vgate1, which is supplied as Vgate to the gates of the transistors of the I mixer 110 as described with reference to FIG. 3A.

FIG. 3B depicts an exemplary embodiment of the receiver of FIG. 2 wherein the offset calibration control 200 generates a voltage VI=Vgate1, which is supplied as Vgate to the gates of the transistors of the I mixer 110 as described with reference to FIG. 3A. The offset calibration control 200 also generates a voltage VQ=Vgate2 supplied to the Q mixer 120, which is used to bias the corresponding gates of transistors in a Q mixer implemented analogously to the I mixer shown in FIG. 3A. By introducing an intentional offset between the voltages VI and VQ, mismatch between the I and Q signal paths may be corrected.

Figure 3C:
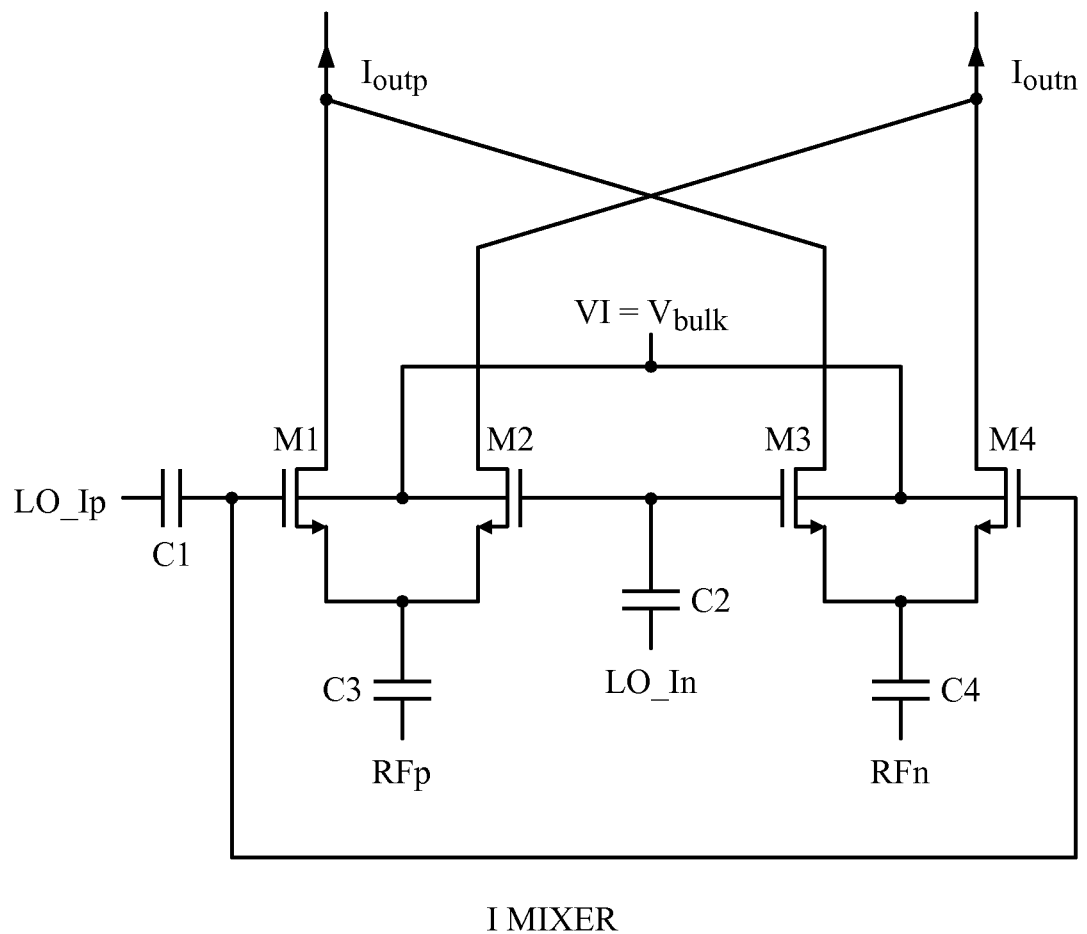
FIG. 3C depicts an alternative exemplary embodiment of the I mixer 110 shown in FIG. 2, wherein the control voltage VI is applied to bias the substrates (or bulks) of transistors M1, M2, M3, M4.

FIG. 3C depicts an alternative exemplary embodiment of the I mixer 110 shown in FIG. 2, wherein the control voltage VI is applied to bias the substrates (or bulks) of transistors M1, M2, M3, M4. In FIG. 3C, the gate biasing of transistors M1, M2, M3, M4 may be fixed, or it may also be made variable in accordance with the principles disclosed previously herein. Note for simplicity, the gate biasing details of the transistors have been omitted from FIG. 3C.

Note one of ordinary skill in the art will realize that the exemplary embodiment depicted in FIG. 3C may be similarly applied to bias the corresponding bulks of transistors in a Q mixer (not shown) using the control voltage VQ.

Figure 3D:
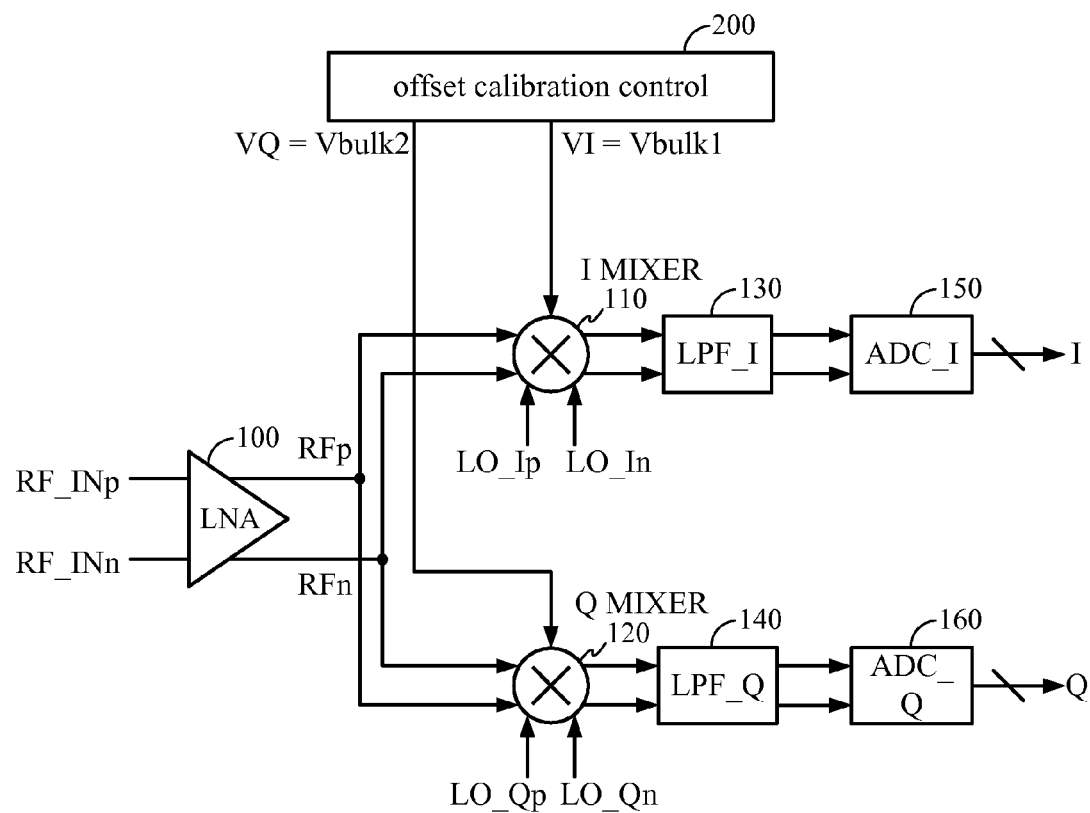
FIG. 3D depicts an exemplary embodiment of the receiver of FIG. 2 wherein the offset calibration control 200 generates a voltage VI=Vbulk1 to bias the bulks of the transistors of the I mixer 110 as described with reference to FIG. 3C.

FIG. 3D depicts an exemplary embodiment of the receiver of FIG. 2 wherein the offset calibration control 200 generates a voltage VI=Vbulk1 to bias the bulks of the transistors of I mixer 110 as described with reference to FIG. 3C. The offset calibration control 200 also generates a voltage VQ=Vbulk2 supplied to the Q mixer 120, which is used to bias the corresponding bulks of transistors in a Q mixer implemented analogously to the mixer shown in FIG. 3C. By introducing an intentional offset between the voltages Vbulk1 and Vbulk2, mismatch between the I and Q signal paths may be corrected.

One of ordinary skill in the art will appreciate that the technique depicted in FIG. 3D requires the transistors (M1, M2, M3, M4) of the I channel mixer to be located in a different well from the corresponding transistors of the Q channel mixer, since the bulk voltage of the I channel mixer should be different from that of the Q channel mixer. This may be possible in RF process technologies having a deep N-well option.

One of ordinary skill in the art will also realize that the techniques described with reference to the passive mixer shown in FIGS. 3A and 3C may also be applied to active mixer topologies. Such exemplary embodiments are contemplated to be within the scope of the disclosure.

Figure 4:
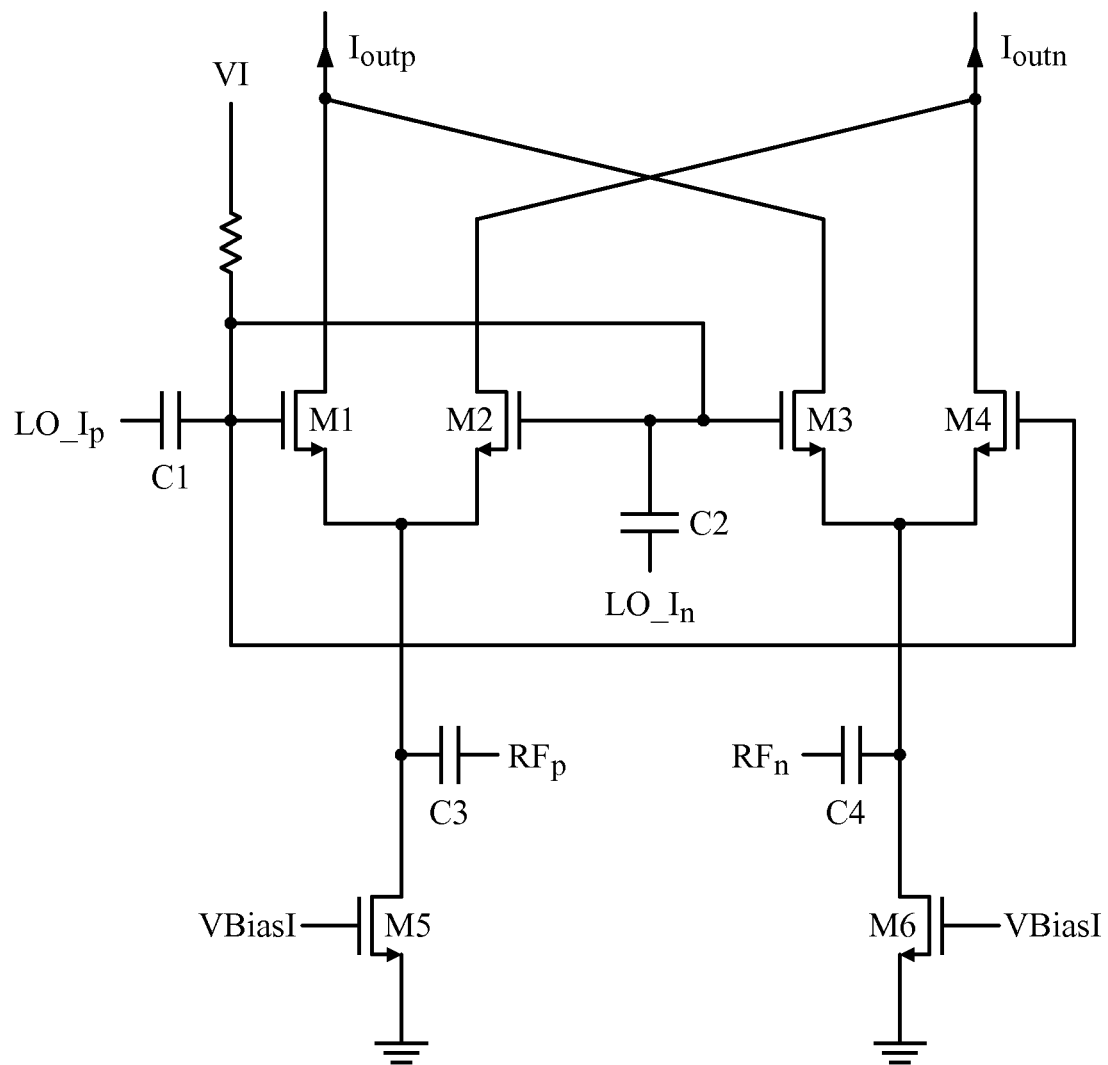
FIG. 4 depicts an exemplary embodiment of an active mixer for the I channel configurable according to the techniques of the present disclosure.

For example, FIG. 4 depicts an exemplary embodiment of an active mixer for the I channel configurable according to the techniques of the present disclosure. In FIG. 4, transistors M5 and M6 provide bias current to differential pairs M1, M2 and M3, M4, respectively, of the active mixer. The gate bias VI applied to the transistors M1, M2, M3, M4 of FIG. 4 may be offset relative to the gate bias VQ applied to a Q mixer (not shown) to correct for I-Q imbalance, as described with reference to FIG. 3A. The bulk bias (not shown) of the transistors may also be made adjustable, as described with reference to FIG. 3C.

In an exemplary embodiment, the offset calibration control 200 may generate a gate bias VBIASI applied to the bias transistors M5, M6 that is offset relative to a corresponding gate bias VBIASQ applied to corresponding bias transistors of a Q mixer (not shown) to correct for I-Q imbalance. In yet another exemplary embodiment, the RF signal RF_p/RF_n may be AC coupled to the gates of transistors M5, M6, rather than to the drains of M5, M6 as shown in FIG. 4. Such exemplary embodiments are contemplated to be within the scope of the present disclosure.

One of ordinary skill in the art may readily derive alternative circuit topologies for active or passive mixers, and apply the principles of the present disclosure to bias an I mixer element with an offset relative to a Q mixer element. Such exemplary embodiments are contemplated to be within the scope of the present disclosure.

Figure 5A:
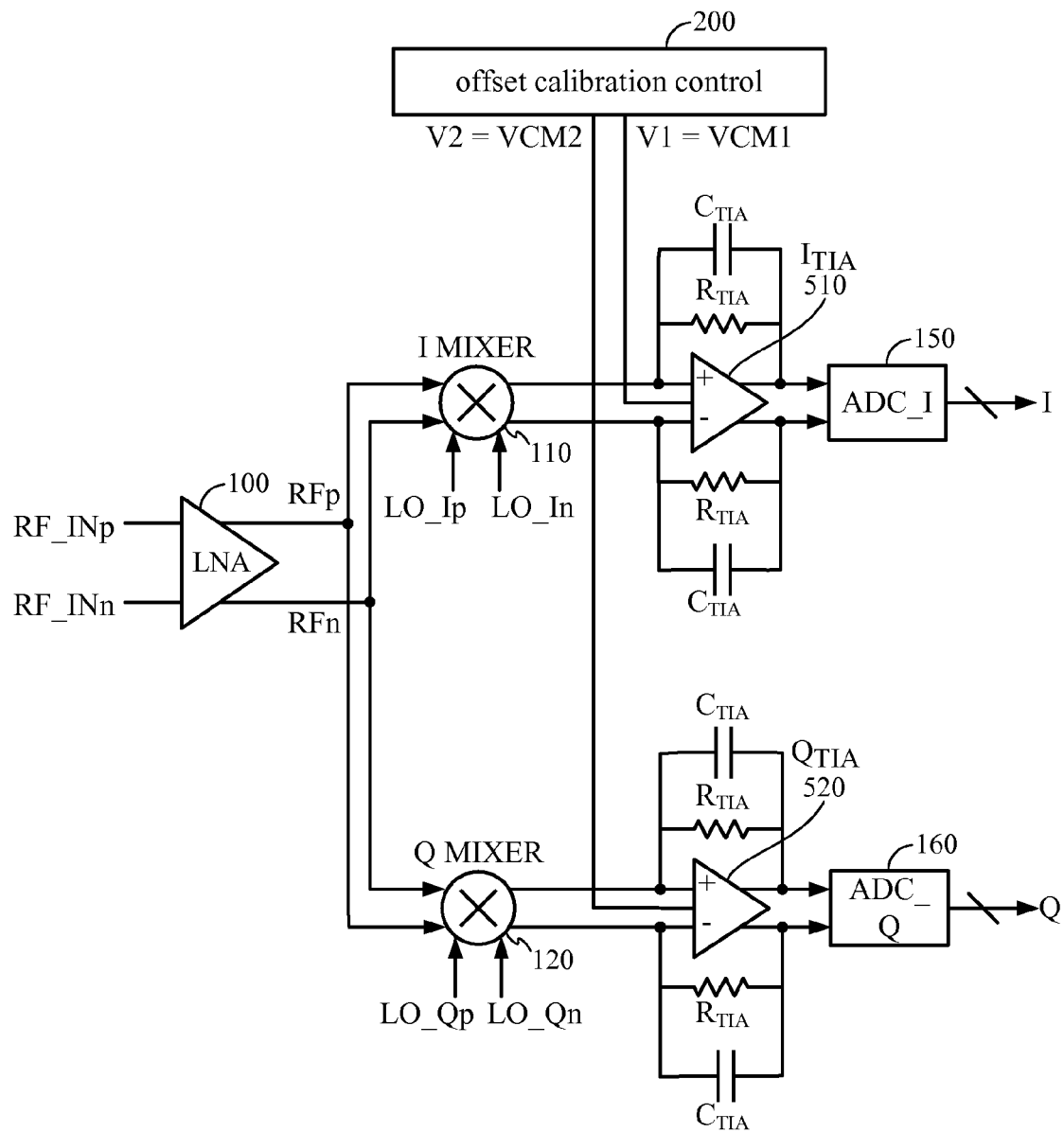
FIG. 5A depicts a direct conversion receiver wherein fully differential transimpedance amplifiers (TIA's) ITIA 510 and QTIA 520 are coupled to the I and Q mixers 110 and 120, respectively.

FIG. 5A depicts a direct conversion receiver wherein fully differential transimpedance amplifiers (TIA's) ITIA 510 and QTIA 520 are coupled to the I and Q mixers 110 and 120, respectively, in case the mixers have current outputs. The TIA's convert the differential output currents of such mixers into differential voltages. Each TIA is provided with an input for receiving a voltage VCM1 or VCM2 for setting a reference voltage for a common-mode feedback (CMFB) circuit of the fully differential TIA. One of ordinary skill in the art will realize that the CMFB circuit is designed to drive the common-mode voltage output of each TIA close to the level set by the reference voltage VCM1 or VCM2.

In an exemplary embodiment, an offset is introduced between the common mode voltage VCM1 applied to the ITIA 510 and the common mode voltage VCM2 applied to the QTIA 520 by offset calibration control 200. The voltages VI and VQ generated by offset calibration control 200 may correspond to the voltages VCM1 and VCM2. By introducing an intentional offset between the voltages VCM1 and VCM2, mismatch between the I and Q channels may be corrected.

Figure 5B:
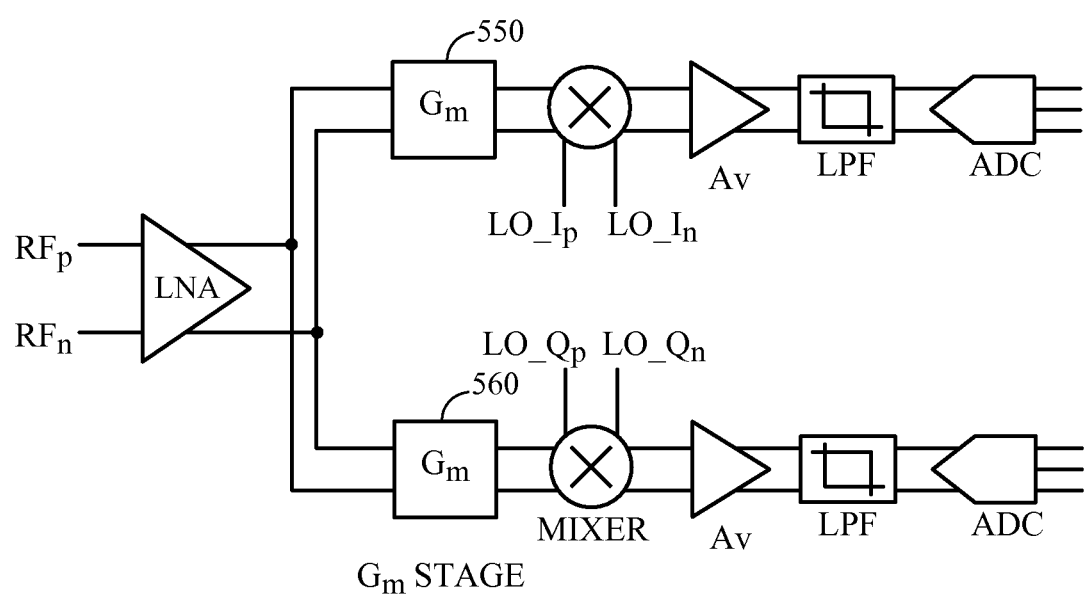
FIG. 5B depicts a voltage-based architecture for a direct conversion receiver wherein a transconductance (Gm) stage precedes each mixer, followed by a voltage amplification (Av) stage.
Figure 5C:
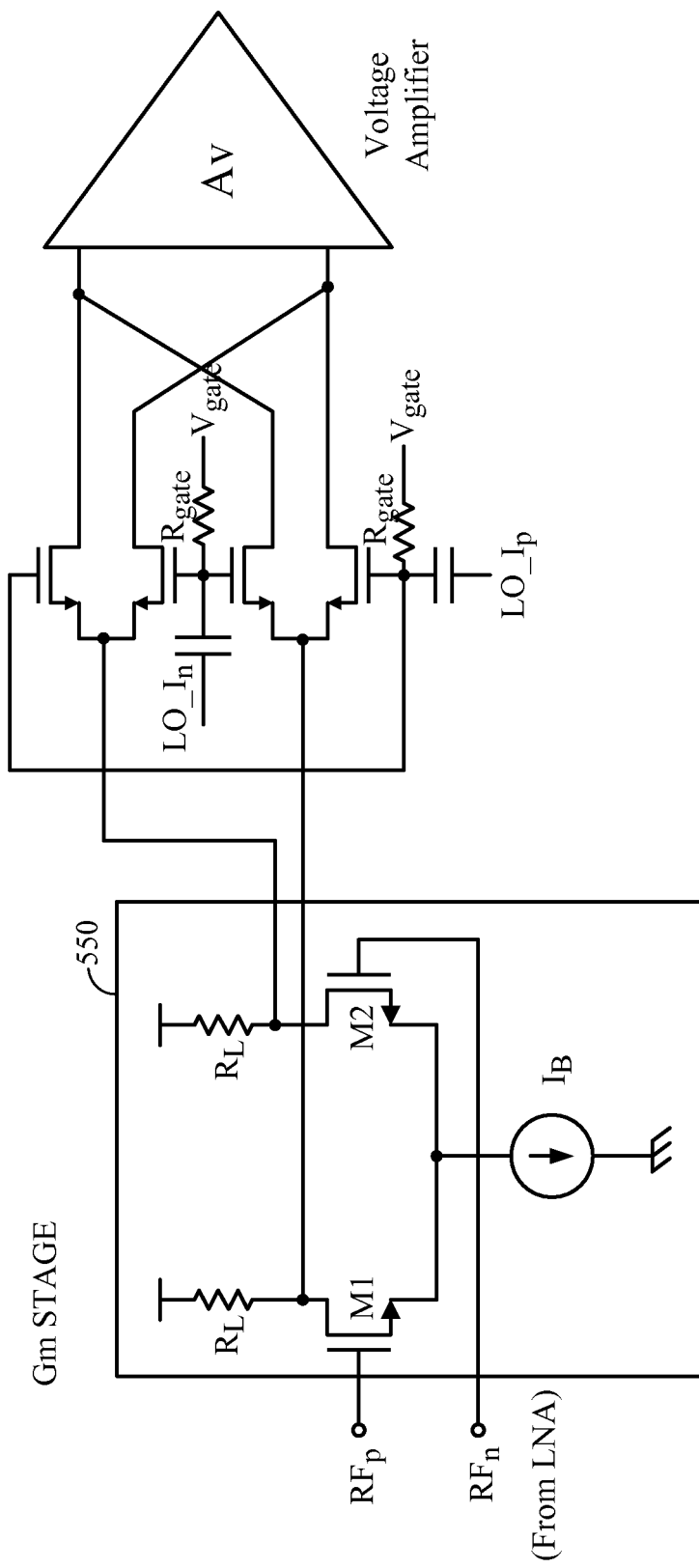
FIG. 5C depicts a portion of exemplary circuitry for the architecture of FIG. 5B, wherein Gm stage 550 of FIG. 5B is implemented as a simple differential pair with a resistive load RL.

One of ordinary skill in the art will realize that according to the present disclosure, an offset may generally be introduced between any corresponding common-mode bias voltages existing in the I and Q channels. For example, FIG. 5B depicts a voltage-based architecture for a direct conversion receiver wherein a transconductance (Gm) stage precedes each mixer, followed by a voltage amplification (Av) stage. FIG. 5C depicts a portion of exemplary circuitry for the architecture of FIG. 5B, wherein Gm stage 550, 560 of FIG. 5B is implemented as a simple differential pair with a resistive load RL. One of ordinary skill in the art will realize that the common-mode voltage of the differential output of the Gm stage 550, 560 in FIG. 5C may be controlled by any of several factors, including the resistance value RL, the size of the transistors M1, M2, and/or the value of the bias current $I_B$. An offset may be introduced in any of these factors between the I and Q channels of a receiver to correct for mixer imbalance according to the present disclosure.

Figure 5D:
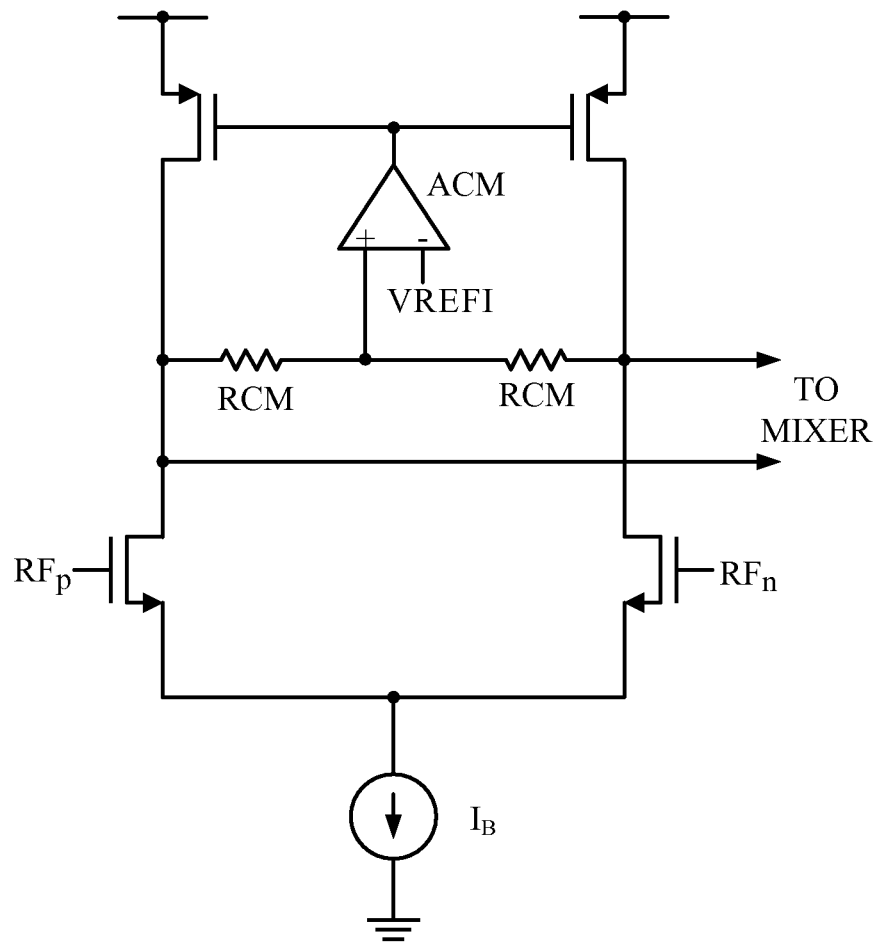
FIG. 5D depicts a scheme wherein a common-mode bias voltage of the Gm stage output may be directly controlled.

Alternatively, a common-mode bias voltage for either channel may be directly controlled using a scheme such as depicted in FIG. 5D for the Gm stage. In FIG. 5D, a reference voltage VREFI may set the common-mode voltage of the Gm stage output for the I mixer via feedback amplifier ACM. Similarly, a reference voltage VREFQ may set the common-mode voltage of a corresponding Gm stage output for a Q mixer (not shown). By introducing an offset between VREFI and VREFQ, the principles of the present disclosure may be applied.

Figure 6:
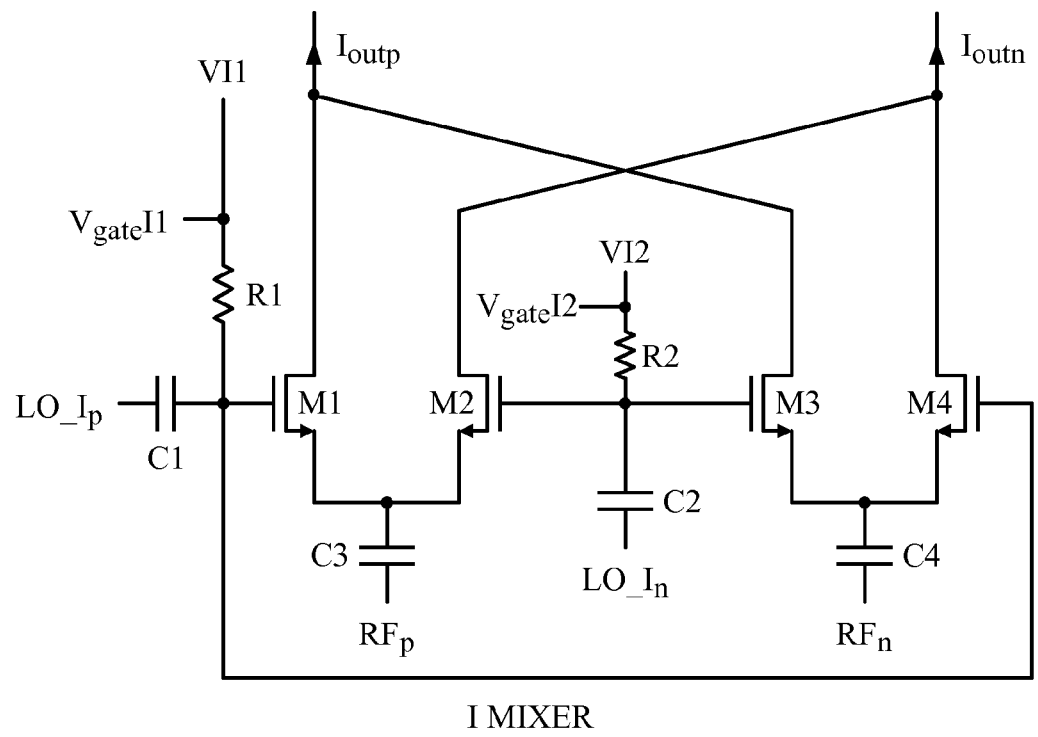
FIG. 6 depicts an exemplary embodiment wherein separate gate bias voltages Vgate I1 and Vgate I2 are provided to the I mixer, and separate gate bias voltages VgateQ1 and VgateQ2 are provided to the Q mixer.
Figure 6:
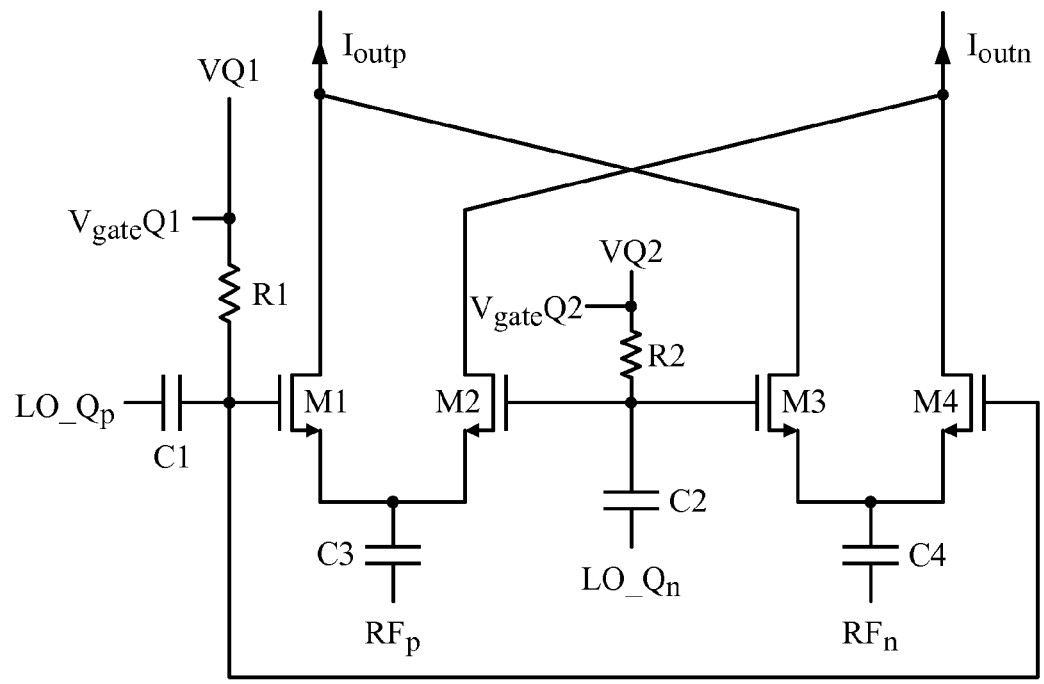
Figure 6A:
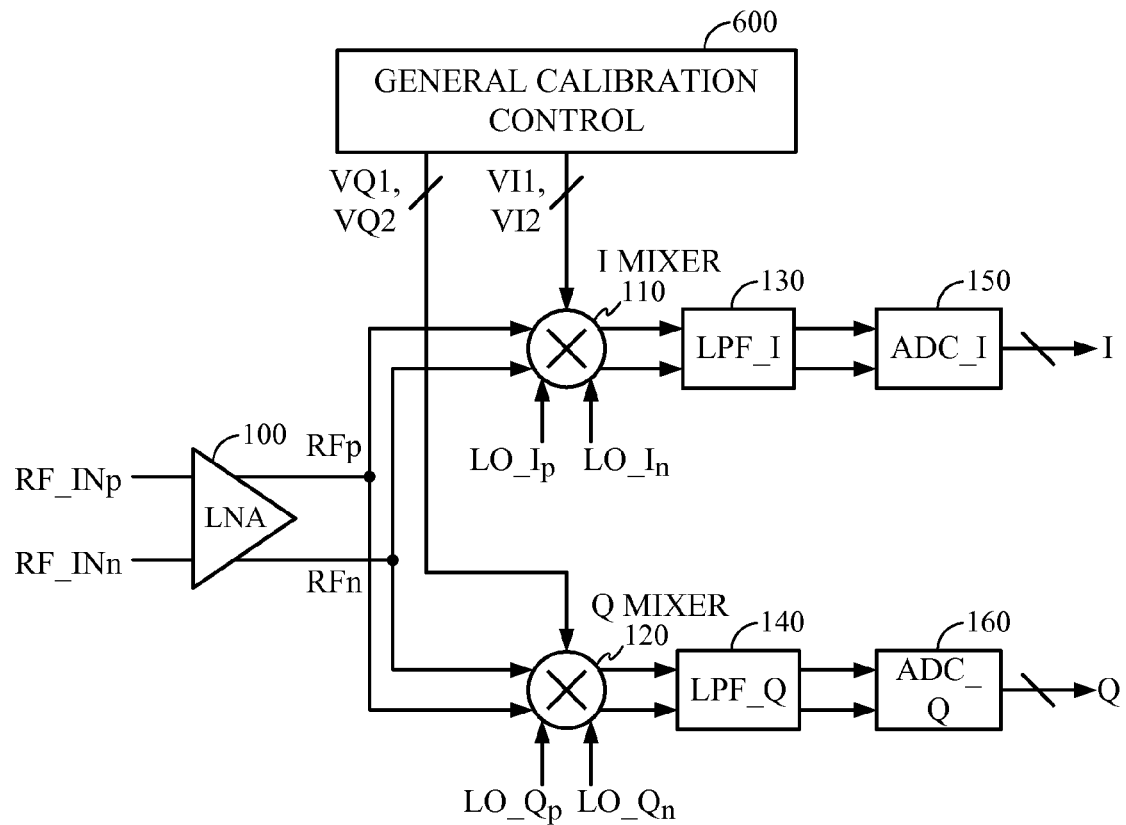
FIG. 6A depicts a generalized mixer calibration control 600 that can adjust both the net offset between the I and the Q mixers, and the offset between transistors M1, M4 and M2, M3 in the differential pairs of each mixer.

In an exemplary embodiment, the techniques for applying a bias offset between the gates and substrates of the I and the Q mixers according to the present disclosure may be combined with the techniques for applying a bias offset between the individual transistors of a differential pair of each mixer, according to the disclosure of U.S. patent application Ser. No. 11/864,310, entitled "Offset correction for passive mixers," filed Sep. 28, 2007, assigned to the assignee of the present application, the contents of which are hereby incorporated by reference in their entirety. For example, FIG. 6 depicts an exemplary embodiment wherein separate gate bias voltages VgateI1 and VgateI2 are provided to the I mixer, and separate gate bias voltages VgateQ1 and VgateQ2 are provided to the Q mixer. FIG. 6A then depicts a generalized calibration control 600 that can adjust both the common-mode offset between the I and the Q mixers, and the differential offset between transistors M1, M4 and M2, M3 in the differential pairs of each mixer.

One of ordinary skill in the art will realize that further gate voltages (not shown) may be applied to separately bias each of the transistors M1-M4 in each mixer in FIG. 6.

Figure 7:
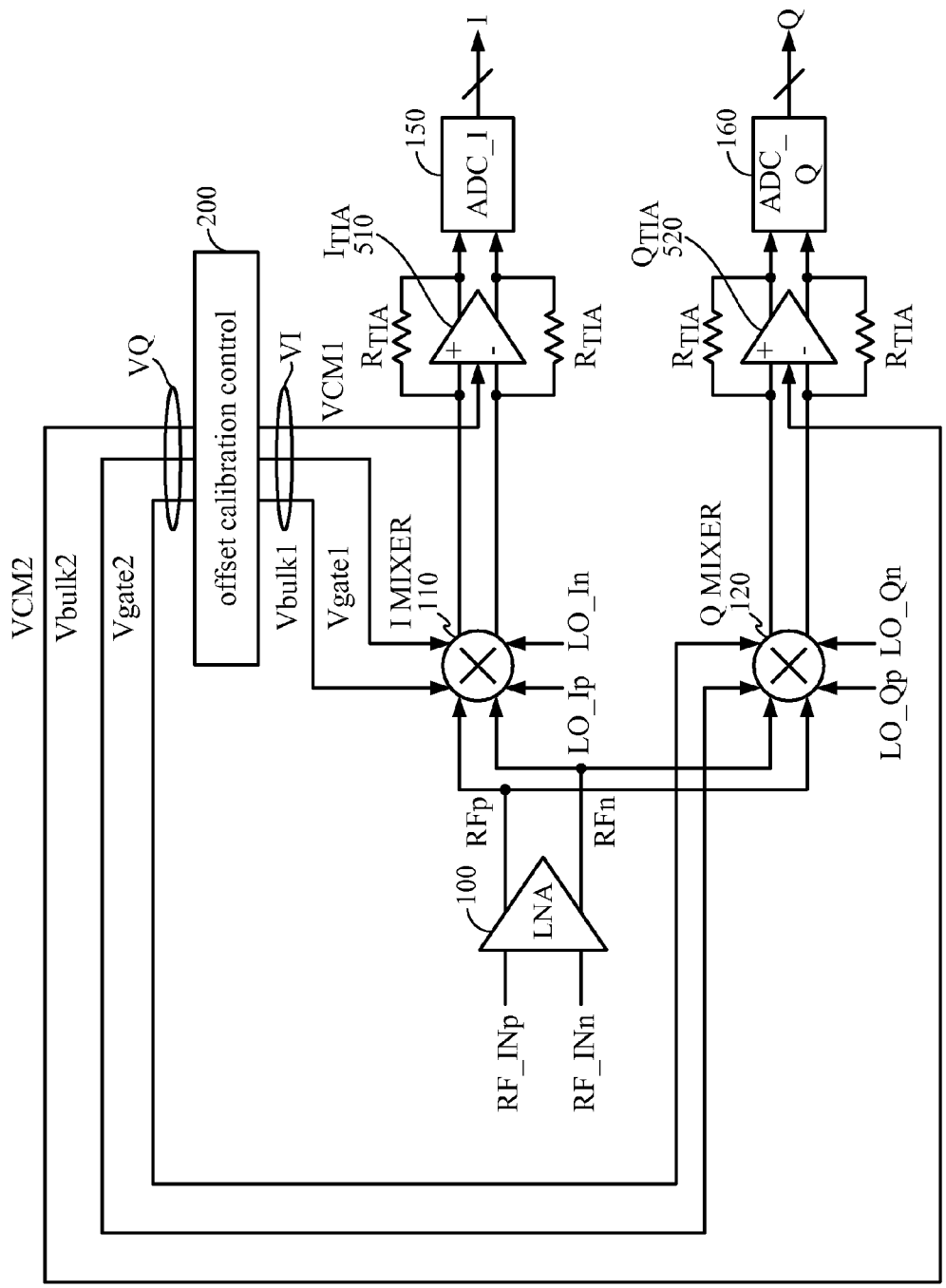
FIG. 7 depicts an exemplary embodiment of a direct conversion receiver wherein the gate bias voltage, the substrate bias voltage, and the common mode reference voltage of each mixer are all made adjustable by offset calibration control 200.

FIG. 7 depicts an exemplary embodiment of a direct conversion receiver wherein the gate bias voltage, the substrate bias voltage, and the common mode reference voltage of each channel are all made adjustable by offset calibration control 200. In this exemplary embodiment, the signals VI and VQ are composite signals, each comprising more than one control voltage per channel.

One of ordinary skill in the art will realize that, in general, each signal VI and/or VQ may be a composite signal that contains some or all of the bias voltages disclosed hereinabove for adjusting bias for a channel. In an exemplary embodiment, any or all of the bias voltages for one of the channels may be fixed, i.e., non-adjustable, while the corresponding bias voltages for the other channel may be made adjustable via offset calibration control 200. Such exemplary embodiments are contemplated to be within the scope of the present disclosure.

Techniques for providing bias offsets to elements in the I-Q signal paths have been disclosed hereinabove. Techniques for adjusting the bias offsets to reduce I-Q mismatch in the channels are further disclosed hereinbelow.

Figure 8:
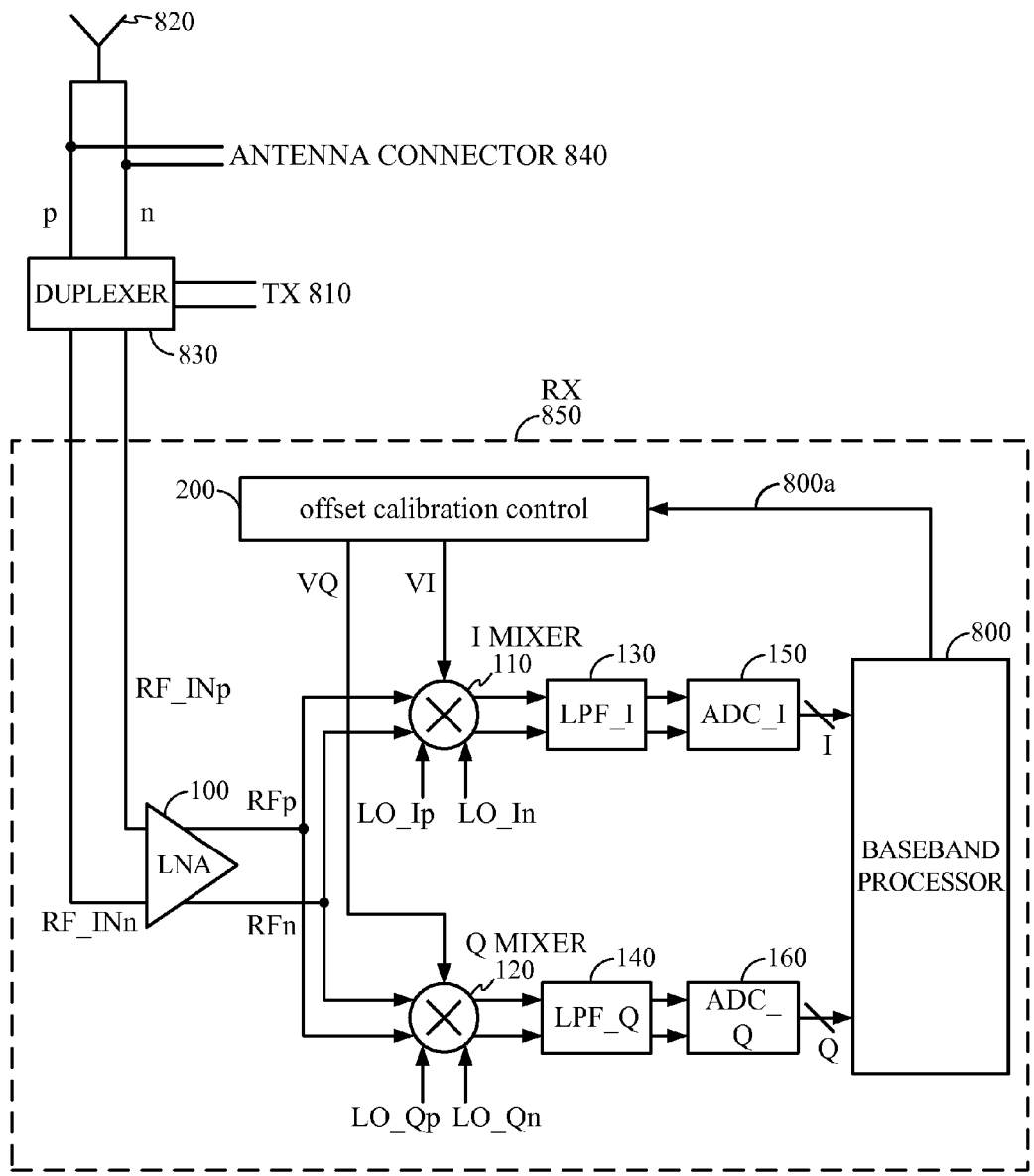
FIG. 8 depicts an exemplary embodiment of a transceiver apparatus according to the present disclosure, wherein the digital output signals I and Q of ADC_I 150 and ADC_Q 160 are supplied to a baseband processor 800.

FIG. 8 depicts an exemplary embodiment of a transceiver apparatus according to the present disclosure, wherein the digital output signals I and Q of ADC_I 150 and ADC_Q 160 are supplied to a baseband processor 800. The baseband processor 800 measures one or more characteristics of the digital signals I and Q, and is coupled to the offset calibration control 200. Based on characteristics of the I and Q signals measured by the baseband processor 800, the offset calibration control 200 generates control voltages VI and VQ.

In an exemplary embodiment, offset calibration control 200 may set voltages VI and VQ to minimize a residual sideband (RSB) of the receiver as measured by the baseband processor 800 from the signals I and Q.

In an exemplary embodiment such as the one depicted in FIG. 6A, a general offset calibration control 600 may jointly optimize the RSB and the second-order input intercept point (IIP2) of the receiver. One of ordinary skill in the art will be able to derive such optimization schemes based on the disclosure of the present application and that of U.S. patent application Ser. No. 11/864,310, entitled "Offset correction for passive mixers," previously referenced herein.

In FIG. 8, an antenna 820 is coupled to an antenna connector 840. The antenna 820 generates a differential signal p/n, which is coupled to a duplexer 830. The duplexer 830 may be configured to couple the antenna connector 840 to either the receive chain (RX) 850 or the transmit chain (TX) 810.

To control an input signal RF_INp/RF_INn reaching the receiver for calibration purposes, a controlled input signal may be supplied to the receiver via antenna connector 840. Alternatively, the transmitter (TX) 810 may generate a controlled signal, and the duplexer 830 may couple the TX output to the RX input through residual coupling. Alternatively, in an architecture (not shown), the controlled signal generated by the TX 810 may be coupled directly to the RX input, i.e., bypassing the duplexer 830, during a calibration phase. In an exemplary embodiment, the controlled input signal may comprise a single reference tone.

Figure 9:
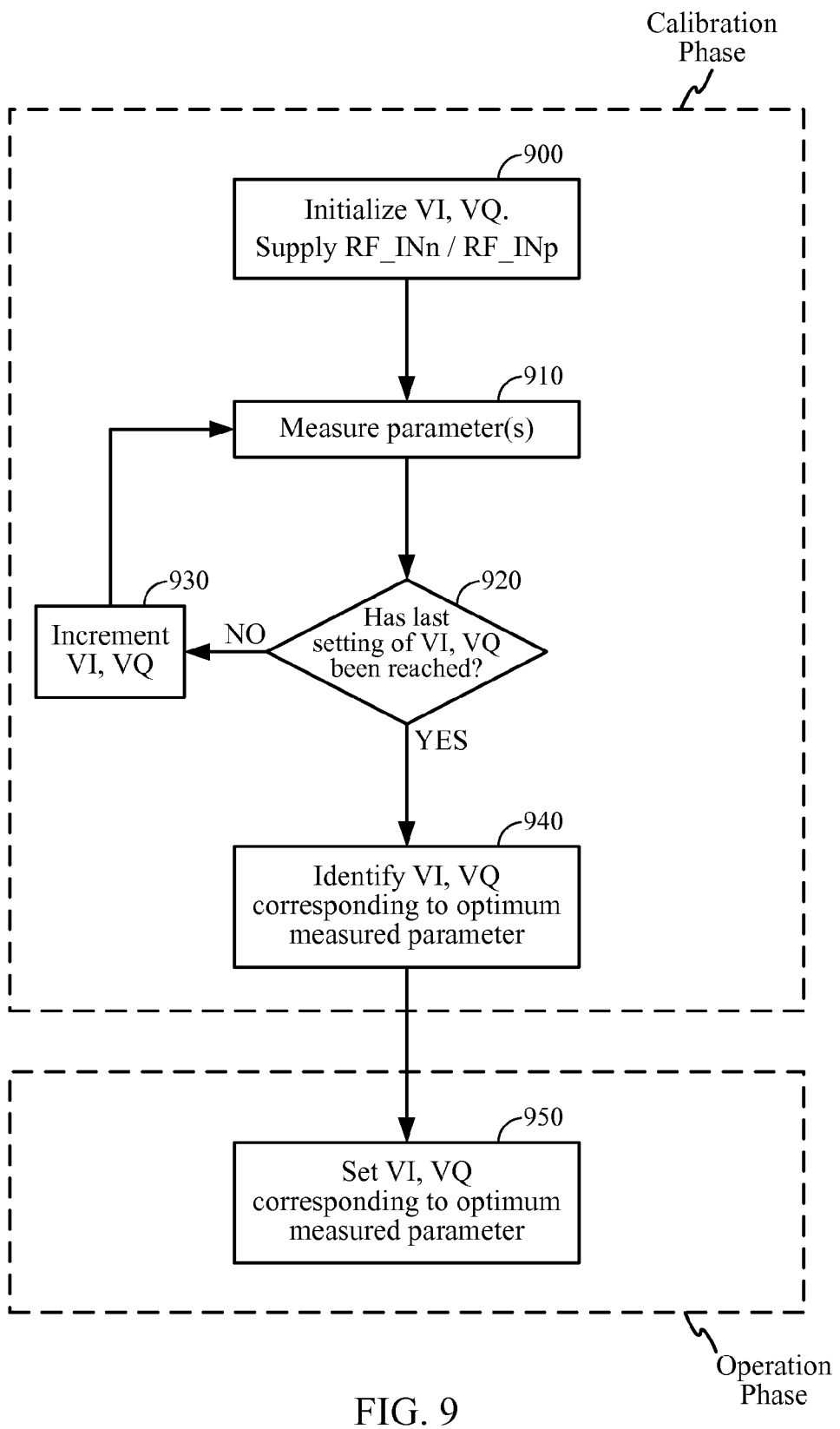
FIG. 9 depicts an exemplary embodiment of an algorithm implemented by offset calibration control 200 for calibrating bias voltages VI and VQ to minimize RSB as measured by the baseband processor 800.

FIG. 9 depicts an exemplary embodiment of an algorithm implemented by offset calibration control 200 for calibrating bias voltages VI and VQ to minimize RSB as measured by the baseband processor 800. In FIG. 9, a calibration phase begins at step 900 by selecting initial values for voltages VI, VQ. Also at step 900, an input signal RF_INp and RF_INn are provided to the receiver, via one of the techniques discussed above.

At step 910, one or more parameters of signals I and Q corresponding to the selected VI, VQ may be measured and recorded by the baseband processor 800. In an exemplary embodiment, the parameter of interest may be a measured residual sideband (RSB) in the signals I and Q. In alternative exemplary embodiments, the parameter(s) of interest may be any parameter(s) that may be affected by voltages VI, VQ generated by offset calibration control 200.

At step 920, the algorithm determines whether a final bias setting for VI, VQ has been reached. If not, then VI, VQ may be advanced to a next candidate VI, VQ setting in step 930. The algorithm then returns to step 910, wherein the parameter(s) of interest corresponding to the new VI, VQ may be measured. Once the final VI, VQ setting has been reached in step 920, the algorithm proceeds to step 940.

In this way, by stepping through candidate VI, VQ settings, the parameter(s) of interest measured in step 910 may be "swept" over a suitable range of VI, VQ settings. After a suitable range has been swept, the VI, VQ setting corresponding to the optimum value of the parameter(s) of interest is identified at step 940. In an exemplary embodiment, the setting or settings corresponding to the lowest RSB in the signals I, Q may be identified.

At step 950, the VI, VQ settings identified in step 940 are selected by offset calibration control 200 and applied to the I and Q channels of the receiver in FIG. 8.

While a specific algorithm for determining an optimal VI, VB setting has been described hereinabove, one of ordinary skill in the art will realize that other algorithms for sweeping through calibration settings to determine an optimal setting may be applied. For example, one may employ calibration algorithms disclosed in U.S. patent application Ser. No. 11/864,310, entitled "Offset correction for passive mixers," previously referenced herein.

Note the calibration techniques disclosed herein may also be applied to optimize any other parameters of interest besides those explicitly described, such as the amplitude or phase gain of either mixer. Such exemplary embodiments are also contemplated to be within the scope of the present disclosure.

In an exemplary embodiment, the calibration phase described in FIG. 9 may be performed when the signal input to the LNA RFp/RFn is known. For example, calibration can be done at the factory, when a chip is tested prior to shipping. Alternatively, calibration can be done during normal operation as follows. Where full duplexing is supported (i.e., simultaneous transmission and reception by a single radio), TX 810 in FIG. 8 may transmit a signal, which is coupled to RX 850 through the residual coupling of the duplexer 830. Note TX 810 may transmit at a suitably high power level to overcome any attenuation between the transmit path and receive path introduced by, for example, the duplexer 830 and/or TX/RX filters (not shown).

In an exemplary embodiment, the offset calibration control 200 may comprise a processor for implementing the steps described in FIG. 9. Code instructing the processor to perform the steps may be stored in any medium such as RAM or ROM accessible by the processor. Offset calibration control 200 may also comprise circuitry, including digital-to-analog conversion circuitry, for generating voltages VI, VQ based on the results of processing the steps of FIG. 9. Such conversion circuitry is later described herein with reference to FIGS. 11 and 12.

Figure 10:
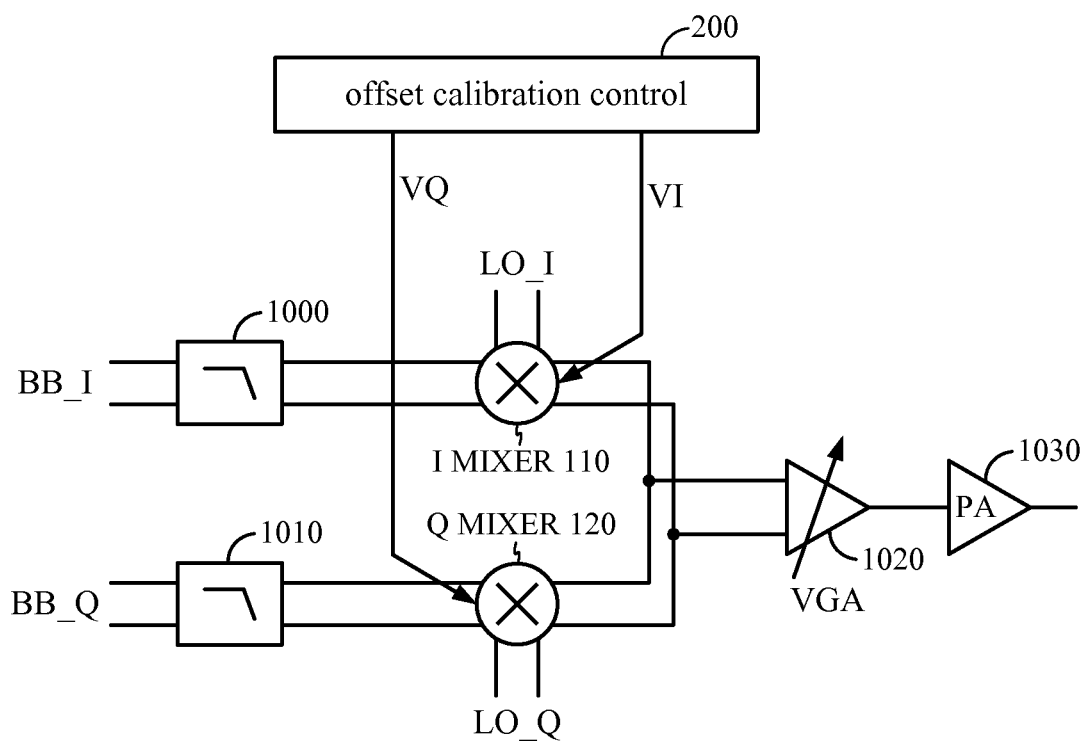
FIG. 10 depicts an exemplary embodiment wherein the techniques disclosed herein are applied to correct for I-Q mismatch in a transmitter apparatus.

FIG. 10 depicts an exemplary embodiment wherein the techniques disclosed herein are applied to correct for I-Q mismatch in a transmitter apparatus. In FIG. 10, I mixer 110 and Q mixer 120 accept baseband input signals BB_I (in-phase) and BB_Q (quadrature-phase) filtered by low-pass filters 1000 and 1010. The mixers 110, 120 modulate the baseband signals to a higher frequency by multiplying with local oscillator signals LO_I and LO_Q. The converted signals are input to a variable-gain amplifier (VGA) 1020, whose output is coupled to a power amplifier (PA) 1030.

In an exemplary embodiment, offset calibration control 200 may generate bias voltages VI and VQ according to the techniques of the present disclosure to calibrate the mixers 110, 120 for I-Q mismatch. Note all of the techniques described herein with respect to biasing an I or Q mixer in a receiver may be applied to bias an I or Q mixer in a transmitter. Also, one of ordinary skill in the art will realize that some exemplary embodiments may partition the functionality of the circuit blocks differently than shown in FIG. 10, for example, the LPF's 1000, 1010 may be incorporated into the functionality of the mixers 110, 120. Such exemplary embodiments are contemplated to be within the scope of the present disclosure.

In an exemplary embodiment, to perform calibration of VI and VQ, the RSB of the PA output may be measured by a "sense loop" (not shown) to downconvert the residual sideband from RF to baseband. The downconverted RSB may be digitized using an ADC, and processed using a baseband processor to adjust the offset calibration control. In an exemplary embodiment, the TX calibration may be done using the architecture shown in FIG. 8 during a "loopback mode" wherein the TX output is coupled directly to the RX input rather than to the antenna.

One of ordinary skill in the art will realize that the techniques disclosed herein need not be applied to the transmitter and receiver configurations explicitly described herein. Rather, the techniques may be applied to any communications apparatus employing I and Q mixers, TIA's, and/or Gm modules. Such exemplary embodiments are contemplated to be within the scope of the present disclosure.

Figure 11:
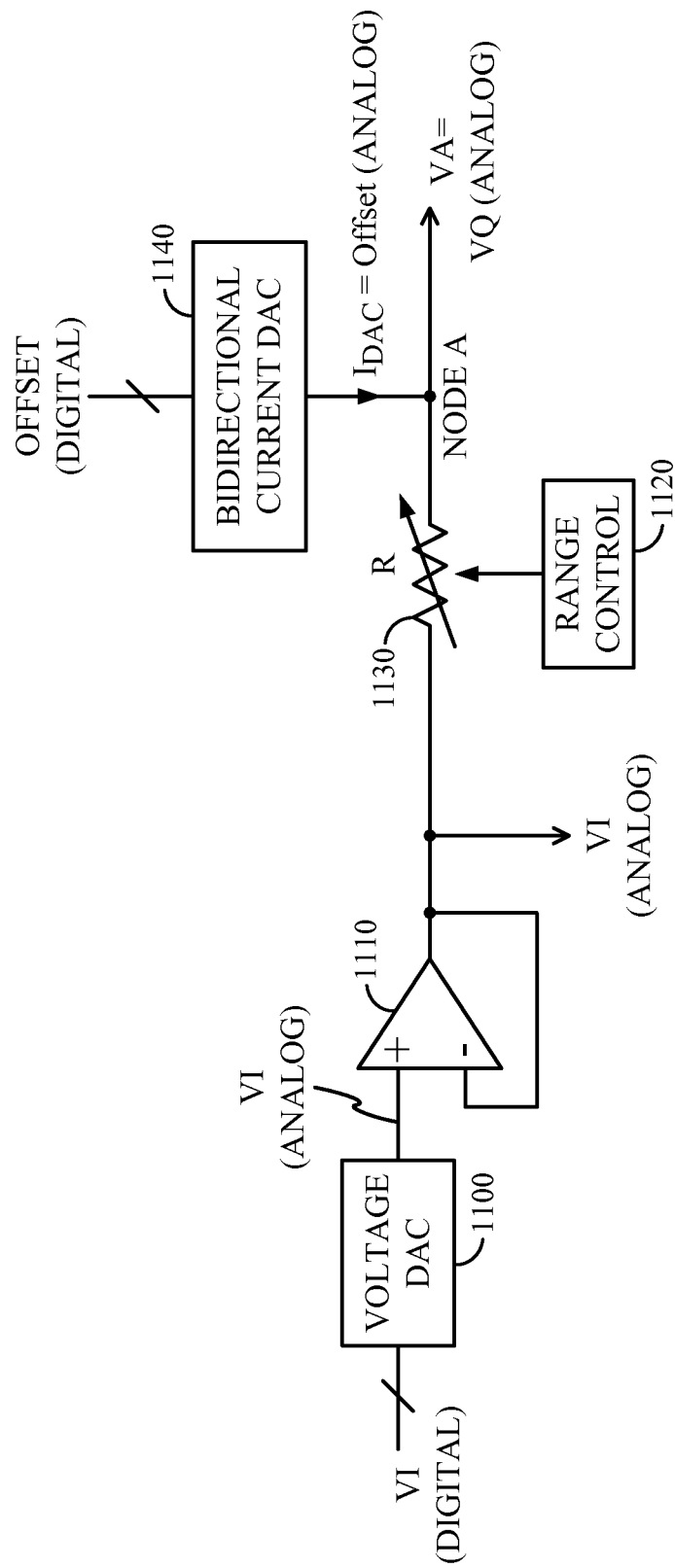
FIG. 11 shows an exemplary embodiment of a voltage and voltage offset generator utilizing a bidirectional current digital-to-analog converter (DAC) to generate the voltages VI and VQ.

In a further aspect of the present disclosure, techniques are provided for offset calibration control 200 to generate the voltages VI and VQ given a single base voltage and an offset. FIG. 11 shows an exemplary embodiment of a voltage and voltage offset generator utilizing a bidirectional current digital-to-analog converter (DAC) to generate the voltages VI and VQ. In FIG. 11, a digital base voltage VI (DIGITAL) is provided to a voltage DAC 1100. The voltage DAC 1100 outputs a corresponding analog voltage VI (ANALOG). In an exemplary embodiment, the voltage DAC 1100 may be a simple resistor chain selectively tapped by one of a plurality of switches. The output of voltage DAC 1100 is coupled to a buffer 1110. In an exemplary embodiment, the output of the buffer 1110 may be supplied by the offset calibration control 200 in FIG. 2 as the control voltage VI.

Also in FIG. 11, a digital offset voltage Offset (DIGITAL) is provided to a bidirectional current digital-to-analog converter (DAC) 1140. Current DAC 1140 outputs an analog current $I_{DAC}$ having an amplitude Offset (ANALOG). At node A, corresponding to the output of current DAC 1140, the voltage is as follows:

$$VA = VI(\text{ANALOG}) + \text{Offset}(\text{ANALOG}) * R;$$

wherein R is a variable resistance adjustable by the range control 1120. In an exemplary embodiment, R is selectable among four different values by specifying a 2-bit digital control signal (not shown).

In the exemplary embodiment shown, current DAC 1140 is a bidirectional current DAC which can both supply current and sink current. For values of Offset (DIGITAL) corresponding to a positive value, DAC 1140 can supply current, while for values of Offset (DIGITAL) corresponding to a negative value, DAC 1140 can sink current, or vice versa. In this way, a voltage VA can be generated that is either higher or lower than the base voltage VI, depending on the programmed sign of Offset (DIGITAL).

In an exemplary embodiment, the voltage VA may be supplied by the offset calibration control 200 in FIG. 2 as the control voltage VQ (ANALOG).

One of ordinary skill in the art will realize that in alternative exemplary embodiments, VQ may be taken as the base voltage, and an offset applied to VQ to generate VI. In other exemplary embodiments, as disclosed hereinbefore, either VI or VQ may comprise a plurality of control voltages, any or all of which may be generated using the techniques shown in FIG. 11. Such exemplary embodiments are contemplated to be within the scope of the present disclosure.

Figure 12:
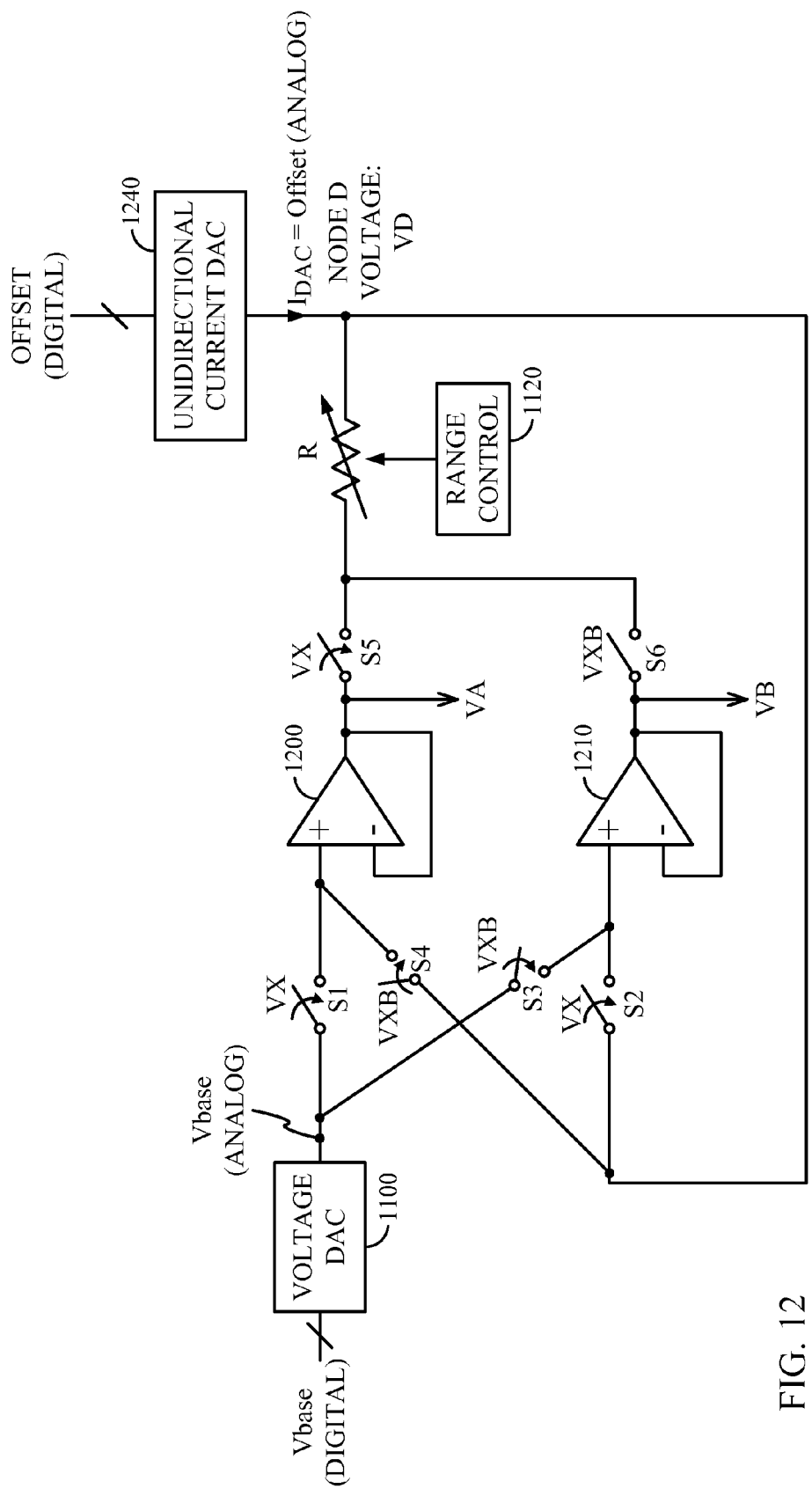
FIG. 12 depicts an exemplary embodiment of a voltage and voltage offset generator utilizing a unidirectional current DAC.

FIG. 12 depicts an exemplary embodiment of a voltage and voltage offset generator utilizing a unidirectional current DAC 1240 to generate the voltages VI and VQ. In FIG. 12, the unidirectional current DAC 1240 sources a current $I_{DAC}$ having an amplitude Offset (ANALOG). One of ordinary skill in the art will realize that in an alternative exemplary embodiment (not shown), with appropriate modifications to the circuitry of FIG. 12, the current DAC 1240 may sink rather than source current.

In FIG. 12, base voltage Vbase (DIGITAL) is supplied to a voltage DAC 1100. The output voltage Vbase(ANALOG) of the voltage DAC 1100 is coupled to either buffer 1200 or buffer 1210, depending on the configuration of switches S1, S2, S3, S4, S5, S6.

In a first configuration, wherein VX is high and VXB is low, S1, S2, S5 are closed, and S3, S4, S6 are open. In this configuration, the output of the voltage DAC 1100 is coupled to the input of buffer 1200, and VA is equal to Vbase(ANALOG). The current $I_{DAC}$ sourced by the current DAC 1240 flows from node D through switch S5 to the output of buffer 1200. The voltage VD at node D is thus given by:

$$VD = V\text{base}(\text{ANALOG}) + \text{Offset}(\text{ANALOG}) * R;$$

wherein R is a variable resistance configurable by range control 1120, as previously described. VD is coupled to the input of buffer 1210 through switch S2, and the output voltage VB of the buffer 1210 is equal to VD. Thus:

$$VB = VA + \text{Offset}(\text{ANALOG}) * R \quad \text{(first configuration)}$$

In a second configuration, wherein VXB is high and VX is low, S1, S2, S5 are open, and S3, S4, S6 are closed. In this configuration, the output of the voltage DAC 1100 is coupled to the input of buffer 1210, and VB is equal to Vbase(ANALOG). The current $I_{DAC}$ sourced by the current DAC 1240 flows from node D through switch S6 to the output of buffer 1210. The voltage VD at node D is given by:

$$VD = VB + \text{Offset(ANALOG)} * R.$$

VD is coupled to the input of buffer 1200 through switch S4, and the output voltage VA of the buffer 1200 is equal to VD. In this case:

$$VA = VB + \text{Offset(ANALOG)} * R \quad \text{(second configuration)}$$

Thus it is seen that in the first configuration, VB is higher than VA by a value Offset (ANALOG)*R, while in the second configuration, VA is higher than VB by Offset (ANALOG)*R.

In an exemplary embodiment, the voltages VI and VQ generated by offset calibration control 200 in FIG. 2 may correspond to the voltages VA and VB in FIG. 12. In this exemplary embodiment, the voltages VI and VQ may be specified by Vbase (DIGITAL), Offset (DIGITAL), variable resistance R, and the configuration of the switches via control voltages VX and VXB.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other exemplary embodiments without departing from the spirit or scope of the invention. Thus, the present invention is not intended to be limited to the exemplary embodiments shown herein but is to be accorded the widest scope consistent with the principles and novel features disclosed herein.

The invention claimed is:

1. An apparatus comprising:
an in-phase (I) signal path and a quadrature (Q) signal path, the I signal path having at least one I bias voltage or I bias current and at least one I local oscillator signal input, and the Q signal path having at least one corresponding Q bias voltage or Q bias current and at least one Q local oscillator signal input; and
an offset calibration control for controlling at least one of the I bias voltage, I bias current, Q bias voltage, or Q bias current, such that at least one of the I bias voltage or I bias current has a different value from a corresponding one of the Q bias voltage or Q bias current;
wherein I bias voltage, I bias current, Q bias voltage, and Q bias current are bias signals representing values used to cause the apparatus to operate over a predetermined range.

2. The apparatus of claim 1, further comprising a communications receiver.

3. The apparatus of claim 1, further comprising a communications transmitter.

4. The apparatus of claim 1, the I and Q signal paths further comprising corresponding I and Q mixers, the at least one I bias voltage or I bias current further comprising a bias voltage or current of the I mixer, and the at least one Q bias voltage or Q bias current further comprising a bias voltage or current of the Q mixer.

5. The apparatus of claim 4, each mixer further comprising at least one differential pair, and the at least one of the I bias voltage, I bias current, Q bias voltage, or Q bias current further comprising a first gate bias voltage of the at least one differential pair of the mixer.

6. The apparatus of claim 5, the at least one of the I bias voltage, I bias current, Q bias voltage, or Q bias current further comprising a second gate bias voltage of the at least one differential pair of the mixer, the first and second gate bias voltages coupled to first and second transistors, respectively, of a single differential pair, the offset calibration control further configured to provide an offset between the first and second gate bias voltages.

7. The apparatus of claim 6, the at least one of the I bias voltage, I bias current, Q bias voltage, or Q bias current further comprising a substrate bias voltage of the at least one differential pair of the mixer.

8. The apparatus of claim 4, the at least one of the I bias voltage, I bias current, Q bias voltage, or Q bias current further comprising a bulk bias voltage of the at least one differential pair of the mixer.

9. The apparatus of claim 5, wherein each mixer is a passive mixer.

10. The apparatus of claim 5, wherein each mixer is an active mixer.

11. The apparatus of claim 4, wherein each mixer is an active mixer, each active mixer comprising at least one biasing transistor, and the at least one of the I bias voltage, I bias current, Q bias voltage, or Q bias current further comprising a bias current associated with the at least one biasing transistor.

12. The apparatus of claim 1, the I and Q signal paths further comprising corresponding I and Q mixers, the I and Q signal paths further comprising corresponding I and Q transimpedance amplifiers (TIA's) coupled to the outputs of the I and Q mixers, respectively, the at least one I bias voltage or I bias current further comprising a bias voltage of the I TIA, and the at least one Q bias voltage or Q bias current further comprising a bias voltage of the Q TIA.

13. The apparatus of claim 12, the bias voltage of the I TIA further comprising a common-mode output voltage of the I TIA, the bias voltage of the Q TIA further comprising a common-mode output voltage of the Q TIA.

14. The apparatus of claim 1, the I and Q signal paths further comprising corresponding I and Q mixers, the I and Q signal paths further comprising corresponding I and Q Gm amplifiers coupled to the inputs of the I and Q mixers, respectively, the at least one I bias voltage or I bias current further comprising a bias voltage of the I Gm amplifier, and the at least one Q bias voltage or Q bias current further comprising a bias voltage of the Q Gm amplifier.

15. The apparatus of claim 14, the bias voltage of the I Gm amplifier further comprising a common-mode output voltage of the I Gm amplifier, the bias voltage of the Q Gm amplifier further comprising a common-mode output voltage of the Q Gm amplifier.

16. The apparatus of claim 1, further comprising a processor, wherein the processor is configured with processor-executable instructions to perform operations comprising:
measuring I and Q input signals coupled to outputs of the I and Q signal paths, respectively; and
adjusting the output signals of the offset calibration control based on the measured I and Q input signals.

17. The apparatus of claim 16, wherein the processor is configured with processor-executable instructions to perform operations further comprising:
adjusting the output signals of the offset calibration control based on a residual sideband measured from the I and Q input signals.

18. The apparatus of claim 1, the offset calibration control further comprising a conversion module for converting two digitally specified voltages into two analog voltages, the at least two digitally specified voltages comprising a first digital signal and a second digital signal, the corresponding analog voltages being generated at a first output node and a second output node, the conversion module comprising:
a voltage digital-to-analog converter for converting the first digital signal to a first analog voltage;
a unidirectional current digital-to-analog converter for converting the second digital signal to a second analog current at a current node;
a first set of switches coupling, when the switches are turned on, the first analog voltage to the current node via the first output node and a resistance; and
a second set of switches coupling, when the switches are turned on, the first analog voltage to the current node via the second output node and a resistance.

19. The apparatus of claim 18, further comprising:
a first buffer coupling the first analog voltage to the first output node when the first switches are turned on; and
a second buffer coupling the first analog voltage to the second output node when the second switches are turned on.

20. The apparatus of claim 18, wherein the voltage at the first output node is provided by the offset calibration control as the at least one of the I bias voltage or I bias current, and wherein the voltage at the second output node is provided by the offset calibration control as the corresponding one of the Q bias voltage or Q bias current.

21. The apparatus of claim 18, wherein the resistance is adjustable in response to a control signal.

22. The apparatus of claim 18, the voltage digital-to-analog converter further comprising a resistor chain.

23. A method for reducing mismatch between in-phase (I) and quadrature (Q) signal paths in a communications apparatus, the method comprising:
applying an offset between a bias for an element of the I signal path and a bias for an element of the Q signal path;
applying at least one I local oscillator signal to the I signal path; and
applying at least one Q local oscillator signal to the Q signal path;
wherein the bias for the element of the I signal path and the bias for the element of the Q signal path are bias signals representing values used to cause the communication apparatus to operate over a predetermined range.

24. The method of claim 23, wherein the communications apparatus further comprises a receiver.

25. The method of claim 23, wherein the communications apparatus further comprises a transmitter, wherein the transmitter comprises the I and Q signal paths.

26. The method of claim 23, wherein the I and Q signal paths further comprises corresponding I and Q mixers, wherein applying an offset further comprises applying an offset between a transistor in the I mixer and a corresponding transistor in the Q mixer.

27. The method of claim 26, wherein applying an offset further comprises applying an offset between the gate of the transistor in the I mixer and the gate of the corresponding transistor in the Q mixer.

28. The method of claim 26, further comprising:
applying a bias offset between a first transistor in the I mixer and a second transistor in the I mixer, the first and second transistors forming a differential pair.

29. The method of claim 26, wherein applying an offset further comprises applying an offset between the bulk of the transistor in the I mixer and the bulk of the corresponding transistor in the Q mixer.

30. The method of claim 27, wherein applying an offset further comprises applying an offset between the bulk of the transistor in the I mixer and the bulk of the corresponding transistor in the Q mixer.

31. The method of claim 26, wherein each mixer is a passive mixer.

32. The method of claim 26, wherein each mixer is an active mixer.

33. The method of claim 26, wherein each mixer is an active mixer, each active mixer comprising at least one biasing transistor, and wherein applying an offset further comprises applying an offset between the bias current associated with the at least one biasing transistor in the I mixer and the at least one biasing transistor in the Q mixer.

34. The method of claim 26, wherein the I and Q signal paths further comprise corresponding I and Q mixers, wherein the I and Q signal paths further comprise corresponding I and Q transimpedance amplifiers (TIA's) coupled to the outputs of the I and Q mixers, respectively, and wherein applying an offset further comprises applying an offset between a bias voltage of the I TIA and a corresponding bias voltage of the Q TIA.

35. The method of claim 34, wherein the bias voltage of the I TIA further comprises a common-mode output voltage of the I TIA, and the bias voltage of the Q TIA further comprises a common-mode output voltage of the Q TIA.

36. The method of claim 23, wherein the I and Q signal paths further comprise corresponding I and Q mixers, and the I and Q signal paths further comprising further comprise corresponding I and Q Gm amplifiers coupled to the inputs of the I and Q mixers, respectively, wherein applying an offset further comprises applying an offset between a bias voltage of the I Gm amplifier and a corresponding bias voltage of the Q Gm amplifier.

37. The method of claim 36, wherein the bias voltage of the I Gm amplifier further comprises a common-mode output voltage of the I Gm amplifier, and the bias voltage of the Q Gm amplifier further comprises a common-mode output voltage of the Q Gm amplifier.

38. The method of claim 26, wherein the communications apparatus further comprises a receiver, wherein the receiver comprises the I and Q signal paths, the method further comprising:
measuring I and Q input signals coupled to the outputs of the I and Q mixers, respectively; and
adjusting the applied offset based on the measured I and Q input signals.

39. The method of claim 38, wherein adjusting the applied offset further comprises adjusting the applied offset based on a residual sideband measured from the I and Q input signals.

40. The method of claim 38, further comprising:
supplying a controlled input signal to the input of the receiver.

41. The method of claim 40, wherein the communications apparatus further comprises a transmitter and a duplexer, wherein supplying a controlled input signal further comprising:
transmitting a controlled input signal using the transmitter; and
coupling the transmitted controlled input signal to the input of the receiver via the duplexer.

42. The method of claim 38, further comprising:
applying a plurality of candidate offsets between a bias for an element of the I signal path and a bias for an element of the Q signal path; and
measuring I and Q input signals coupled to the outputs of the I and Q mixers for each of the plurality of candidate offsets applied.

43. The method of claim 42, wherein adjusting the applied offset based on the measured I and Q input signals further comprises applying the candidate offset associated with a lowest residual sideband computed from the measured I and Q input signals.

44. The method of claim 23, wherein the communications apparatus further comprises a transmitter, wherein the transmitter comprises the I and Q signal paths, the I signal path further comprising an I mixer and the Q signal path further comprising a Q mixer, the method further comprising:
applying a reference I signal to an input of the I mixer;
applying a reference Q signal to an input of the Q mixer;
measuring a parameter of the signal transmitted by the transmitter; and
adjusting the applied offset based on the measuring the parameter of the signal transmitted by the transmitter.

45. The method of claim 44, wherein the parameter of the signal transmitted by the transmitter is a residual sideband.

46. The method of claim 45, wherein the communications apparatus further comprises a duplexer and a receiver, wherein measuring the parameter of the signal transmitter by the transmitter further comprises coupling the signal transmitted by the transmitter to the input of the receiver via the duplexer, and wherein adjusting the applied offset further comprises applying an offset associated with a lowest residual sideband of the measured transmitted signal between a bias element for the I mixer and a bias element for the Q mixer.

* * * * *